United States Patent
Li et al.

(10) Patent No.: US 11,622,463 B2
(45) Date of Patent: Apr. 4, 2023

(54) CHASSIS AND CAGE THEREOF

(71) Applicant: Wistron Corporation, New Taipei (TW)

(72) Inventors: Ying Li, New Taipei (TW); Yong-Liang Zheng, New Taipei (TW)

(73) Assignee: WISTRON CORPORATION, New Taipei (TW)

(*) Notice: Subject to any disclaimer, the term of this patent is extended or adjusted under 35 U.S.C. 154(b) by 168 days.

(21) Appl. No.: 17/156,804

(22) Filed: Jan. 25, 2021

(65) Prior Publication Data
US 2022/0174834 A1     Jun. 2, 2022

(30) Foreign Application Priority Data
Dec. 1, 2020 (CN) .......................... 202011382736.1

(51) Int. Cl.
H05K 7/14     (2006.01)
(52) U.S. Cl.
CPC ......... H05K 7/1401 (2013.01); H05K 7/1488 (2013.01)
(58) Field of Classification Search
CPC ............................ H05K 7/1401; H05K 7/1488
See application file for complete search history.

(56) References Cited

U.S. PATENT DOCUMENTS

| | | | | |
|---|---|---|---|---|
| 6,590,848 | B1* | 7/2003 | Chen | G11B 33/128 720/650 |
| 7,806,489 | B2* | 10/2010 | Selvidge | G11B 33/128 312/222 |
| 8,469,466 | B2* | 6/2013 | Gong | G06F 1/187 312/223.2 |
| 2005/0094369 | A1* | 5/2005 | Chen | G06F 1/187 |
| 2005/0116135 | A1* | 6/2005 | Peng | G11B 33/124 |
| 2008/0174950 | A1* | 7/2008 | He | G11B 33/124 361/679.31 |
| 2010/0196117 | A1* | 8/2010 | Murakami | F16B 19/1081 411/21 |

FOREIGN PATENT DOCUMENTS

TW     I553448 B2    10/2016
TW     M579432 U    6/2019

* cited by examiner

*Primary Examiner* — Matthew W Ing
(74) *Attorney, Agent, or Firm* — McClure, Qualey & Rodack, LLP

(57) ABSTRACT

A chassis includes a cage. The cage includes a body, a clamping member, and a buckling member. The body includes a first sliding portion, a fastening portion, and an accommodating area. The accommodating area includes a guide rail portion. The guide rail portion and the first sliding portion are disposed on two sides of the accommodating area, respectively. The fastening portion is disposed on one side of the accommodating area away from the guide rail portion. The clamping member is slidably disposed on the first sliding portion. The buckling member is disposed on the clamping member. The buckling member is adapted to be in contact with the fastening portion.

20 Claims, 16 Drawing Sheets

CHASSIS AND CAGE THEREOF

CROSS-REFERENCE TO RELATED APPLICATION

This non-provisional application claims priority under 35 U.S.C. § 119(a) to Patent Application No. 202011382736.1 filed in China, P.R.C. on Dec. 1, 2020, the entire contents of which are hereby incorporated by reference.

BACKGROUND

Technical Field

The present invention relates to a chassis and a cage thereof, and in particular, to a cage for fixing an expansion card.

Related Art

A cabinet of a rack-mounted servo machine is generally configured with a plurality of slidable server units. The server units may carry a large number of units (for example, hard disks or flash memories), to collaboratively perform big data operations in the cloud. A plurality of expansion modules are mounted in a chassis of a server, and a plurality of expansion cards are mounted inside each of the expansion modules. Generally, the expansion module has a fixed structure supported on a side of the expansion card, but a space between the fixed structure and the side of the expansion card is limited. If a relatively long expansion card is mounted, the space between the fixed structure and the side of the expansion card is even smaller. As a result, transmission lines which are electrically connected to the expansion card cannot be inserted into the space. Alternatively, a rotatable fixed structure may be rotated to open the side of the expansion card or may be rotated to cover the side of the expansion card. However, the rotatable fixed structure requires a rotation path which occupies a relatively large configuration space. In addition, for the rotatable fixed structure, a latch on the fixed structure needs to be disassembled before the fixed structure is manually rotated to the top side, then the expansion card can be removed or mounted. The way to operate the rotatable fixed structure is inconvenient and laborious.

SUMMARY

In view of this, according to some embodiments, a cage includes a body, a clamping member, and a buckling member. The body includes a first sliding portion, a fastening portion, and an accommodating area. The accommodating area includes a guide rail portion. The guide rail portion and the first sliding portion are disposed on two sides of the accommodating area, respectively. The fastening portion is disposed on one side of the accommodating area away from the guide rail portion. The clamping member is slidably disposed on the first sliding portion. The buckling member is disposed on the clamping member. The buckling member is adapted to be in contact with the fastening portion.

In some embodiments, the clamping member is adapted to move along the first sliding portion between a first position and a second position. When the clamping member is in the first position, the clamping member is away from the guide rail portion and the buckling member is separated from the fastening portion. When the clamping member is in the second position, the clamping member is adjacent to the guide rail portion and the buckling member is snap-fitted to the fastening portion.

In some embodiments, one of the buckling member and the fastening portion is provided with a return structure. When the clamping member moves toward the first position, the return structure is adapted to move the buckling member away from the fastening portion.

In some embodiments, the buckling element includes a first stop, a second stop, a buckling block and a return member. The buckling block is disposed between the first stop and the second stop. The return member is disposed between the buckling block and the second stop. One side of the buckling block is provided with a buckling portion. The buckling portion is sleeved on the first stop and is adapted to be snap-fitted to or detached from the fastening portion.

In some embodiments, one side of the buckling block opposite to the buckling portion is provided with a groove. The second stop is provided with a bump facing the buckling block. One end of the return member is restricted in the groove, and the other end thereof is sleeved on the bump.

In some embodiments, the fastening portion includes an engaging block. The engaging block is positioned on the body. The engaging block is provided with a buckling hole and a guiding surface. The guiding surface is adapted to guide the buckling portion to be positioned into the buckling hole.

In some embodiments, the fastening portion is provided with a buckling hole. The buckling portion is provided with a guiding surface. The guiding surface is adapted to guide the buckling portion into the buckling hole.

In some embodiments, the buckling member includes a first stop and a return member. One side of the return member is provided with a buckling portion. The buckling portion of the return member threads the first stop and is adapted to be snap-fitted to or detached from the fastening portion.

In some embodiments, the buckling member includes a leaf spring. The leaf spring is provided with a protrusion extending toward the body. The protrusion is adapted to be automatically snap-fitted to or detached from the fastening portion.

In some embodiments, the body has a bottom plate and a side plate. The bottom plate and the side plate are connected and form an angle relative to each other. The fastening portion is disposed on the side plate, the first sliding portion is disposed on the bottom plate. The fastening portion and the first sliding portion form an angle relative to each other.

In some embodiments, the body includes a second sliding portion. The second sliding portion is disposed on the side plate. The clamping member is docked to the second sliding portion. The second sliding portion and the first sliding portion form an angle relative to each other.

In some embodiments, the clamping member includes a third sliding portion and a fourth sliding portion. The third sliding portion and the fourth sliding portion form an angle relative to each other. The third sliding portion and the fourth sliding portion are adapted to be docked to the side plate and the bottom plate of the body.

In some embodiments, the first sliding portion includes a first long groove and a first locking member. The first locking member is threaded in the first long groove and is locked to the clamping member. The third sliding portion includes a third long groove and a third locking member. The third locking member is threaded in the third long groove and is locked to the body. The fourth sliding portion includes a fourth long groove and a fourth locking member. The fourth locking member is threaded in the fourth long groove and is locked to the body.

In some embodiments, the second sliding portion includes a folding portion and a trench. The folding portion is folded from one side of the side plate. The trench is located between the folding portion and the side plate.

In some embodiments, one side of the body away from the guide rail portion includes a plurality of limiting portions. The plurality of limiting portions is adapted to be restricted on one side of the clamping member.

In some embodiments, the cage further includes a limiting member disposed on a side surface of the clamping member that faces the body. The side surface of the limiting member has a recess.

In some embodiments, the cage further includes a limiting member. The limiting member is disposed on a side surface of the clamping member that faces the body. The side surface of the limiting member has a plurality of recesses and a plurality of protrusions arranged alternately.

In some embodiments, the clamping member includes a holding portion. The holding portion is adjacent to the buckling member.

In some embodiments, a chassis is provided, including a housing and a cage. The cage is disposed in the housing. The cage includes a body, a clamping member, and a buckling member. The body includes a first sliding portion, a fastening portion, and an accommodating area. The accommodating area includes a guide rail portion. The guide rail portion and the first sliding portion are disposed on two sides of the accommodating area, respectively. The fastening portion is disposed on one side of the accommodating area away from the guide rail portion. The clamping member is slidably disposed on the first sliding portion. The buckling member is disposed on the clamping member and is adapted to be in contact with the fastening portion.

Based on the above, according to some embodiments, the body is applicable to mounting of expansion modules of different lengths. The clamping member slides on the side of the body and covers the expansion module. When the expansion module is shaken due to a vibration or drop test, transportation, or artificial or natural factors, the clamping member can prevent the expansion module from loosening or falling. Next, according to some embodiments, the holding portion of the clamping member and the buckling member are disposed adjacent to each other, so that by using one hand, the clamping member can be detached from the body and the holding portion can be pushed to detach, through sliding, the clamping member from the expansion module. In addition, according to some embodiments, the clamping member is slidably assembled on the side of the body, which requires only a space for the clamping member to slide on the side of the body, so that a small space is occupied. Moreover, according to some embodiments, a plug-in end at a side of the expansion module is exposed to inside of a frame opening formed by the clamping member, which facilitates electrical connection of a transmission line to the plug-in end.

DETAILED DESCRIPTION

Figure 1:
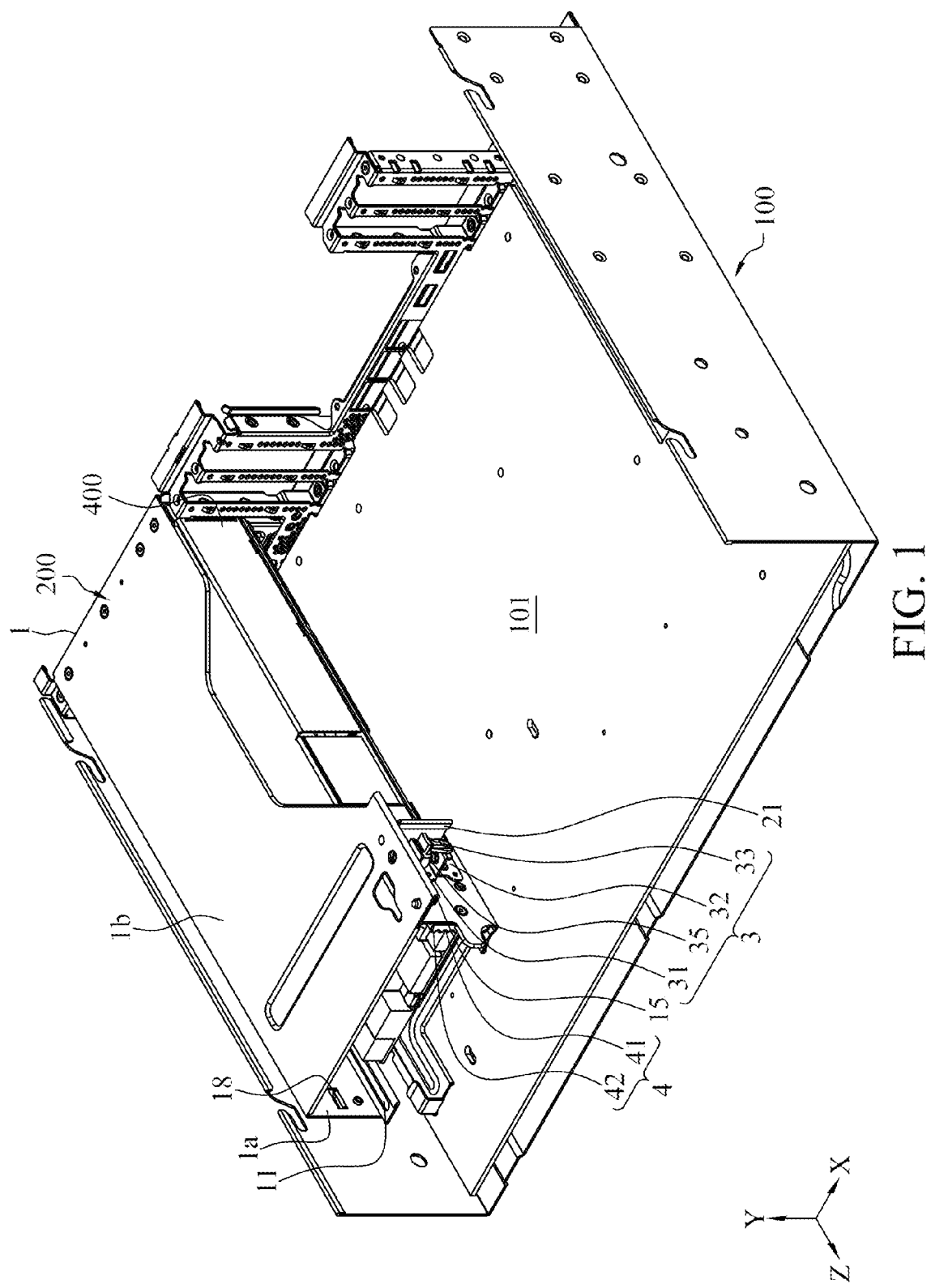
FIG. 1 illustrates a schematic diagram of an appearance of a chassis having a cage according to some embodiments.

Referring to FIG. 1, FIG. 1 is a schematic diagram of an appearance of a chassis 100 having a cage 200. In some embodiments, a network device, for example, a switch, a router or a hardware firewall, uses a rack structure. The chassis 100 includes a housing 101. One or more cages 200 are mounted in the housing 101 (FIG. 1 shows that one cage 200 is mounted in the chassis 100, and a plurality of cages 200 may also be provided). The cage 200 may be mounted at any position in the chassis 100, and an expansion module 400 is mounted in the cage 200.

In some embodiments, the expansion module 400 may be, but is not limited to, an expansion card, for example, a peripheral component interconnect express card (PCIe card). In some embodiments, the expansion module 400 may be other devices, for example, a hard disk. In addition, there may be a plurality of (for example, two, three or four) expansion cards or one expansion card.

Figure 11:
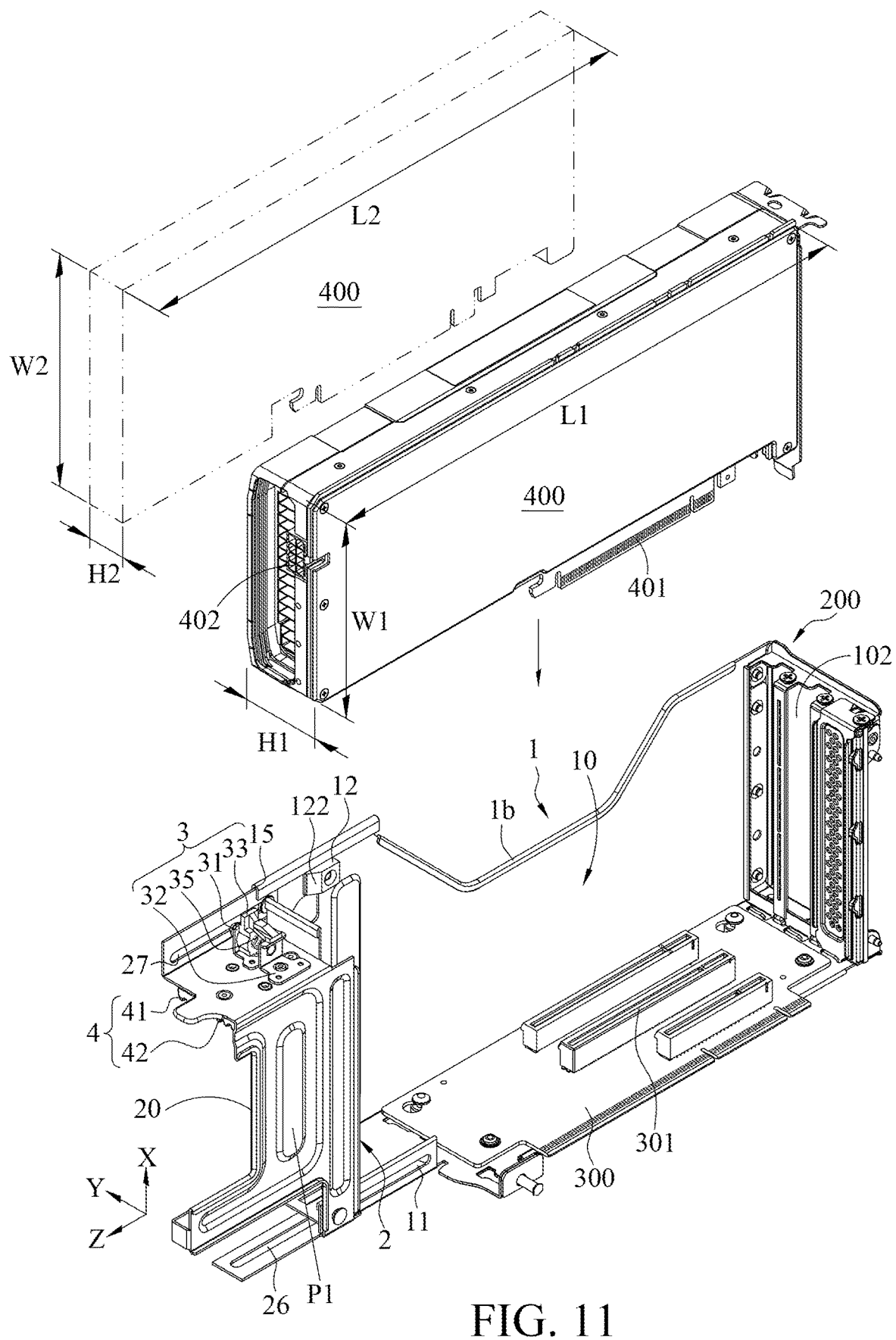
FIG. 11 illustrates a schematic diagram of appearances of a cage and an expansion module according to some embodiments, showing a state in which a clamping member slides out of an accommodating area and expansion modules of different lengths are not mounted in the accommodating area.

In some embodiments, the cage 200 may be applicable to mounting of expansion modules 400 of different lengths, for example, an expansion module 400 of a first length L1 (a long card) shown by a solid line shown in FIG. 11, which is a full-height full-length (FHFL) PCIe card, or an expansion module 400 of a second length L2 (a long card) indicated by a two-dot line (an imaginary line) shown in FIG. 11, which is a full-height full-length (FHFL) PCIe card. The two expansion modules 400 have different lengths, and the first length L1 is greater than the second length L2. In some embodiments, the cage is applicable to, for example, an expansion module 400 of a short length (a short card) indicated by two dot lines shown in FIG. 24, which is a full-height half-length (FHHL) PCIe card, but the present invention not limited thereto. In some embodiments, a half-height half-length (HHHL) PCIe card may also be used.

Figure 2:
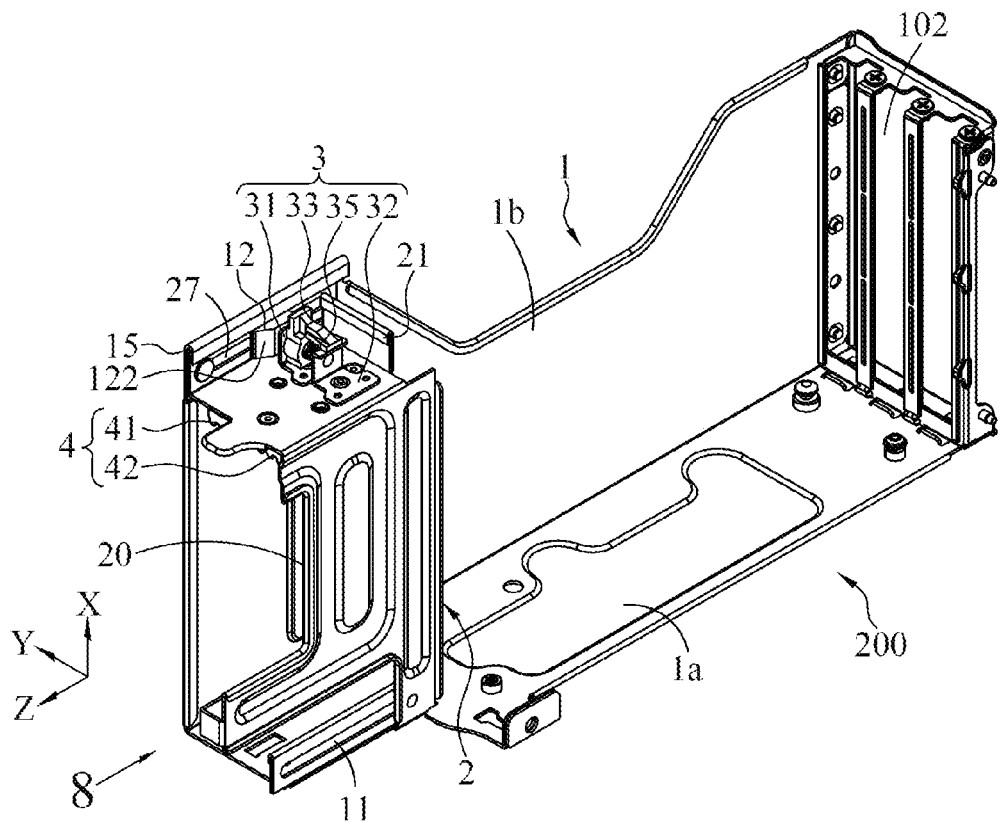
FIG. 2 illustrates a schematic diagram of an appearance of a cage according to some embodiments.
Figure 3:
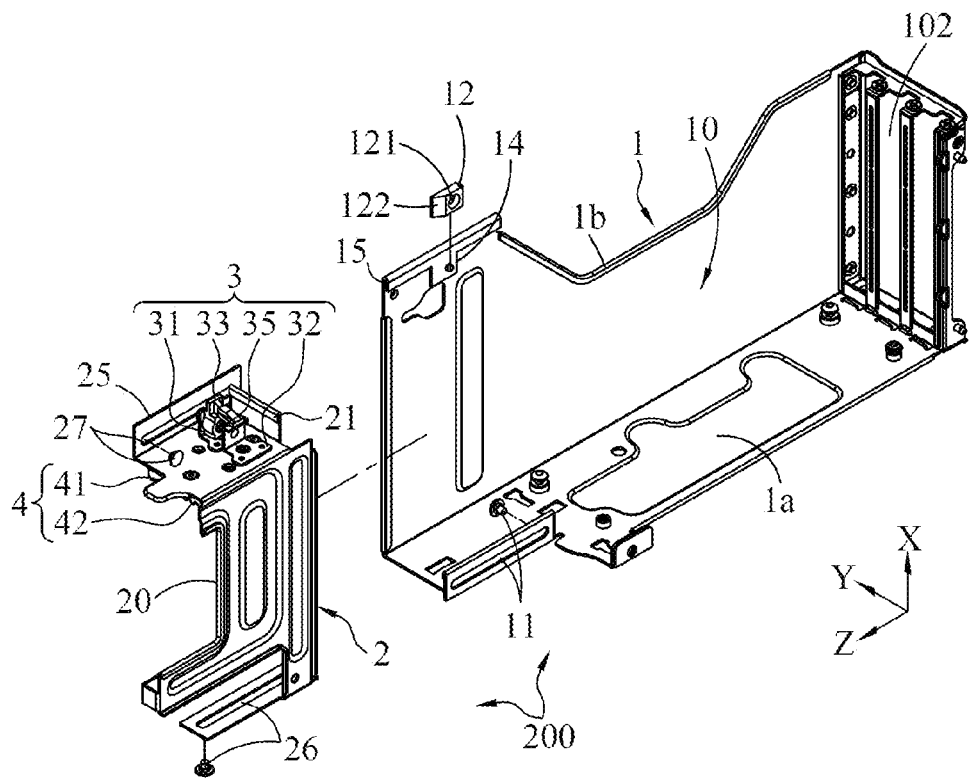
FIG. 3 illustrates a schematic exploded view of a cage according to some embodiments.

Referring to FIG. 2 and FIG. 3 together, FIG. 2 is a schematic diagram of an appearance of a cage 200, and FIG. 3 is a schematic exploded view of a cage 200. In some embodiments, the cage 200 includes a body 1, a clamping member 2, and a buckling member 3.

The body 1 includes a first sliding portion 11, a fastening portion 12, and an accommodating area 10. The accommodating area 10 includes a guide rail portion 102. The guide rail portion 102 is used for an expansion module 400 to be slidably disposed in the accommodating area 10 by in a direction of a third axis X. The first sliding portion 11 and the guide rail portion 102 are respectively disposed on two sides of the accommodating area 10, or may be disposed on two sides of the body 1, but the present invention is not limited thereto. The fastening portion 12 is disposed on one side of the accommodating area 10 away from the guide rail portion 102.

The clamping member 2 is slidably disposed on the first sliding portion 11.

The buckling member 3 is disposed on the clamping member 2. The buckling member 3 is adapted to be in contact with the fastening portion 12.

In some embodiments, the clamping member 2 is adapted to move (move along a first axis Z) between a first position P1 and a second position P2 (a first position P1 shown in FIG. 13 and a second position P2 shown in FIG. 15) along the first sliding portion 11. When the clamping member 2 is at the first position P1, the clamping member 2 is away from the guide rail portion 102. The buckling member 3 is separated from the fastening portion 12. When the clamping member 2 is at the second position P2, the clamping member 2 is close to the guide rail portion 102. The buckling member 3 is in contact with the fastening portion 12 in a snap-fitted way, but not limit to.

Figure 12:
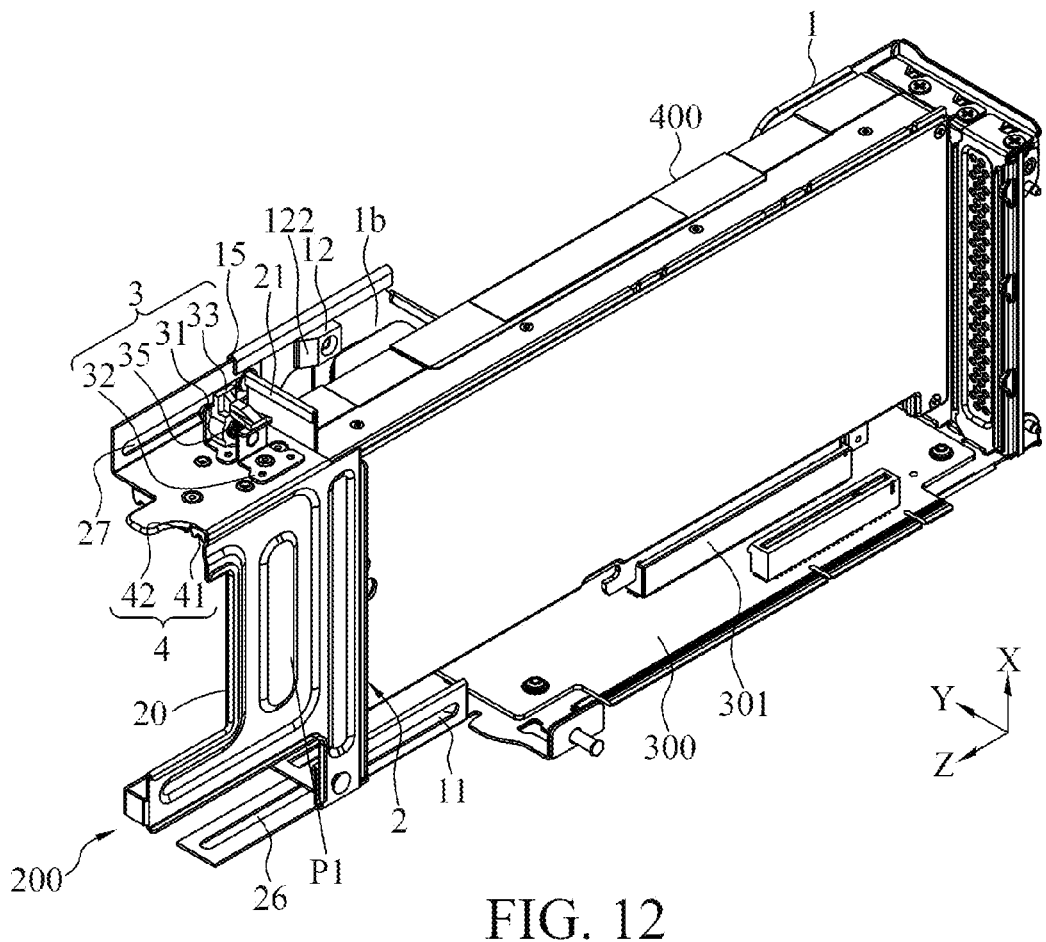
FIG. 12 illustrates a schematic diagram of appearances of a cage and an expansion module according to some embodiments, showing a state in which a clamping member slides out of an accommodating area for the expansion module to be mounted in the accommodating area.

When the clamping member 2 slides out of the accommodating area 10 (as shown in FIG. 11, it means that the clamping member 2 is away from the guide rail portion 102) when moving to the first position P1, the expansion module 400 may be mounted in the accommodating area 10 of the body 1 (which is shown in FIG. 12). When the clamping member 2 moves from the first position P1 to the second position P2 along the first axis Z, the clamping member 2 slides into the accommodating area 10 (that is, the clamping member 2 is close to the guide rail portion 102). The clamping member 2 covers one side of the expansion module 400 and at least a part of the expansion module 400 (one side of the expansion module 400 shown in FIG. 14 and FIG. 15 away from the guide rail portion 102 is clamped by the body 1 and the clamping member 2), to prevent the expansion module 400 from falling or detaching from the body 1 as a result of being shaken.

Figure 13:
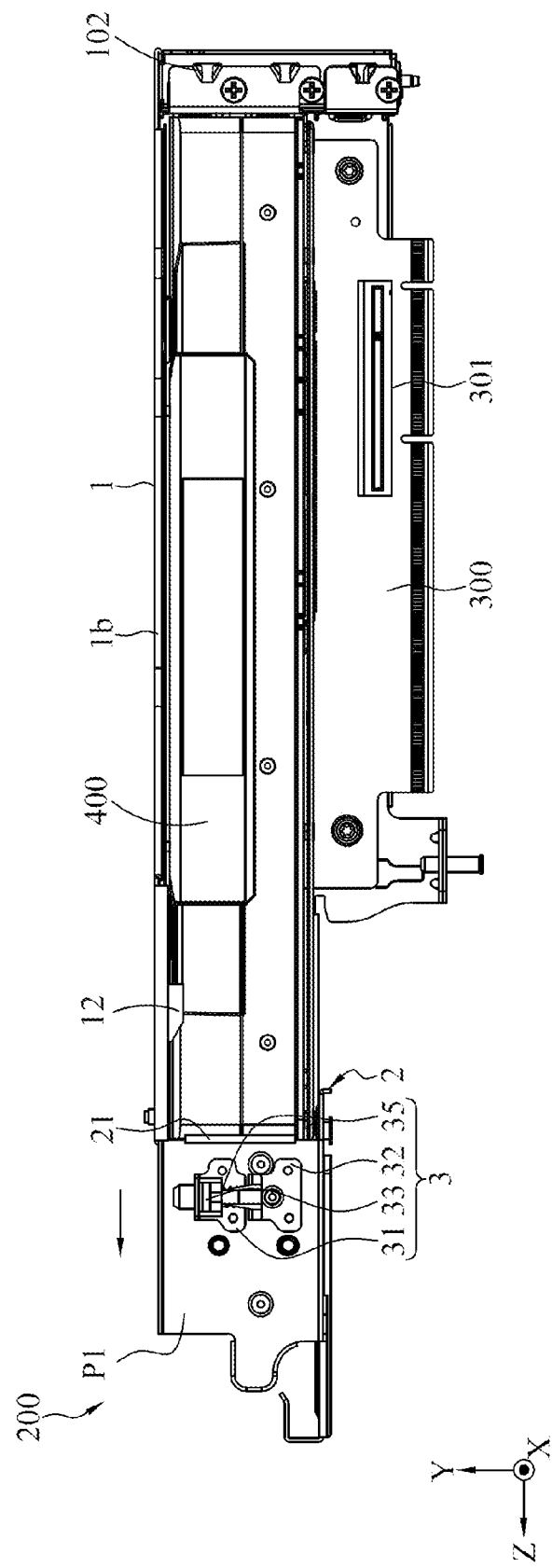
FIG. 13 illustrates a schematic top view of the state in FIG. 12.
Figure 14:
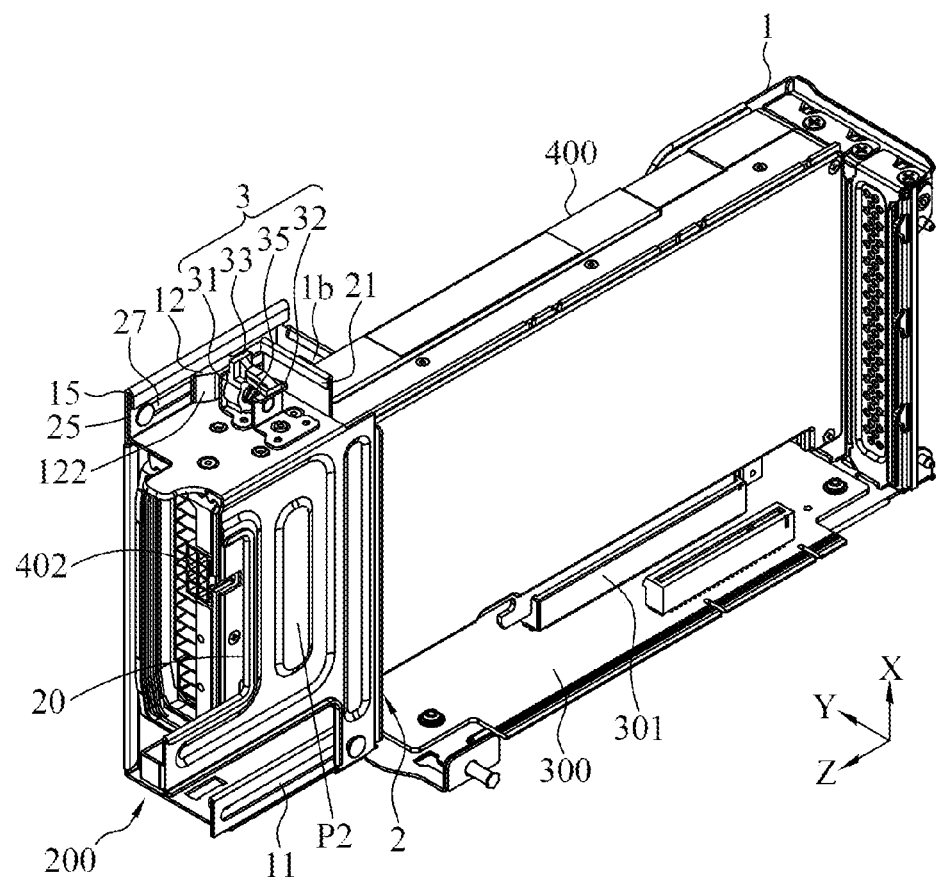
FIG. 14 illustrates a schematic diagram of appearances of a cage and an expansion module according to some embodiments, showing a state in which a clamping member is located in an accommodating area, and the clamping member covers a side of the expansion module, where a buckling member is automatically snap-fitted to a fastening portion.
Figure 15:
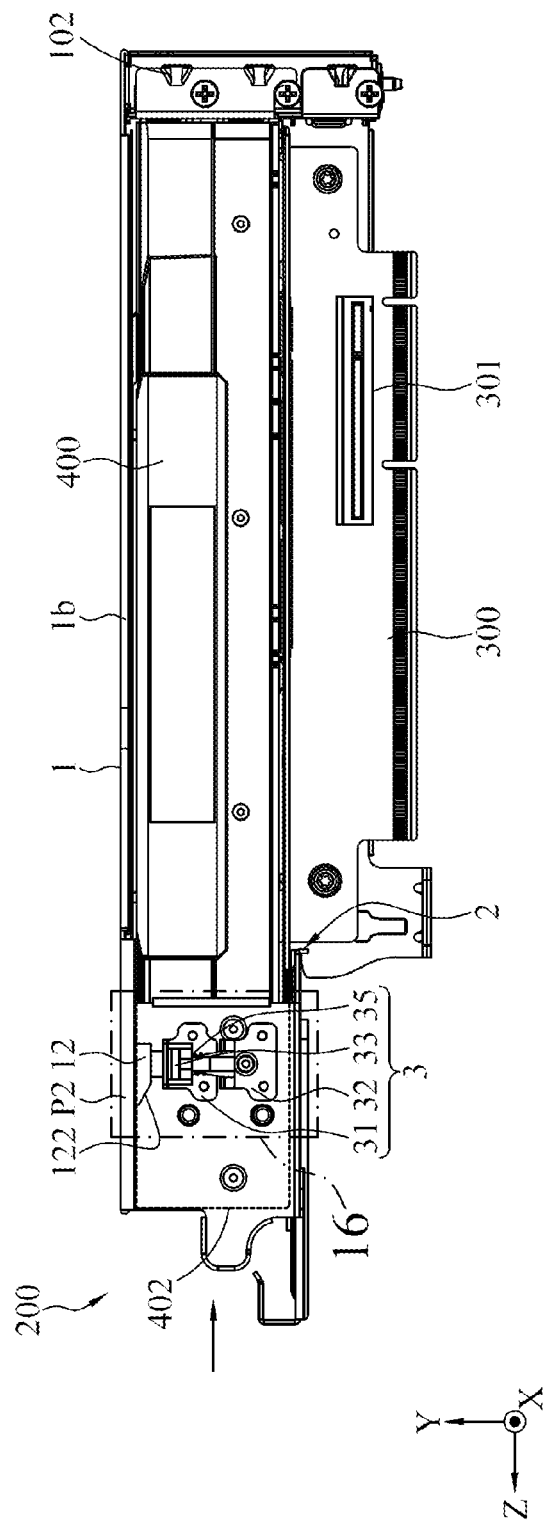
FIG. 15 illustrates a schematic top view of the state in FIG. 14.

In some embodiments, the clamping member 2 is restricted on one side of the body 1 and clamps one side of the expansion module 400 (which is shown in FIG. 14). When the clamping member 2 moves toward the first position P1, the clamping member 2 slides out of the body 1 along the first sliding portion 11 (which is shown in FIG. 12 and FIG. 13) for the expansion module 400, which is a long card, to be mounted in the accommodating area 10 along the guide rail portion 102. When the clamping member 2 moves to the second position P2, the clamping member 2 slides into the body 1 to be close to the guide rail portion 102 (which is shown in FIG. 14 and FIG. 15), so as to cover one side of the expansion module 400 and at least a part of the expansion module 400, thereby supporting the expansion module 400.

Figure 24:
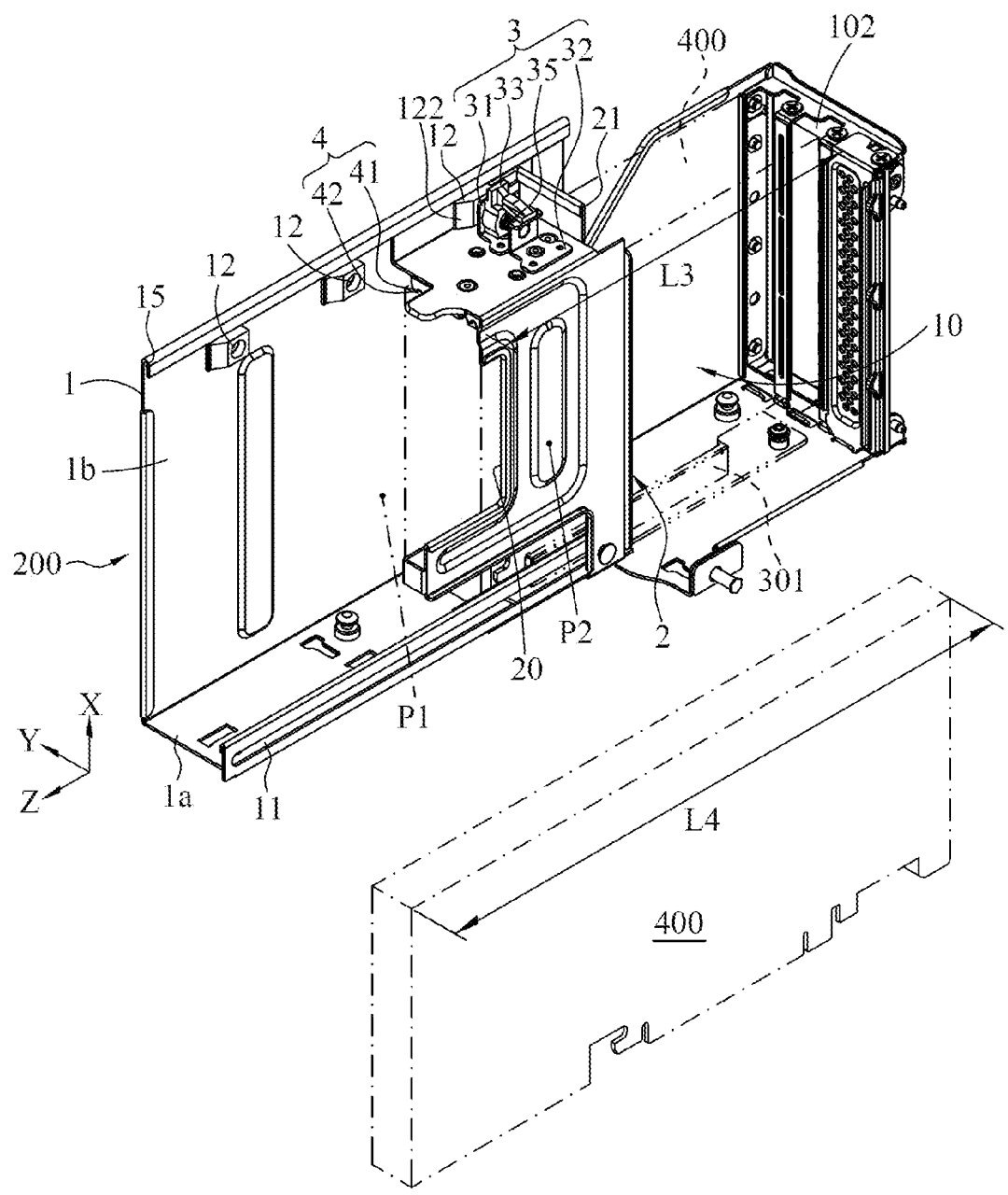
FIG. 24 illustrates a schematic diagram of appearances of a cage and an expansion module according to some embodiments, showing a state in which a clamping member is located in another accommodating area, and the clamping member covers a side of the expansion module indicated by two dot lines.

In some embodiments, the clamping member 2 is restricted inside the body 1 and clamps the expansion module 400, which is used for the expansion module 400, which is a short card (which is shown in FIG. 24). When the clamping member 2 is to move to the first position P1 (which is not shown, for example, the clamping member 2 shown in FIG. 24 is at a position at the first position P1 indicated by a dot line), the clamping member 2 moves in a direction away from the guide rail portion 102 to the first position P1 to reach a position in the body 1 farthest from the guide rail portion 102, which may be used for mounting the expansion module 400 in the accommodating area 10 along the guide rail portion 102. When the clamping member 2 is to move to the second position P2, the clamping member 2 slides to the second position P2 (a position at P2 indicated by a solid line) toward the guide rail portion 102 along the first axis Z, to cover one side of the expansion module 400. In some embodiments, one of the buckling member 3 and the fastening portion 12 is provided with a return structure. When the clamping member 2 moves toward the first position P1, the return structure moves the buckling member 3 away from the fastening portion 12.

In some embodiments, the return structure may move the buckling member 3 away from the fastening portion 12 in the following manner. The buckling member 3 has elasticity and is adapted to be detached from the fastening portion 12. Alternatively, the fastening portion 12 has elasticity to pop out to be detached from the buckling member 3. Specific structures of the buckling member 3 and the fastening portion 12 are to be described later.

In some embodiments, since the buckling member 3 is located on the clamping member 2, when the clamping member 2 moves from the first position P1 toward the second position P2 along the first axis Z, the clamping member 2 simultaneously drives the buckling member 3 to move along the first axis Z during movement. When the buckling member 3 moves to a corresponding position at the fastening portion 12, the buckling member 3 may be automatically snap-fitted to the fastening portion 12 along a second axis Y relative to the body 1. On the contrary, when the clamping member 2 moves from the second position P2 toward the first position P1 along the first axis Z, the clamping member 2 simultaneously drives the buckling member 3 to move along the first axis Z while during movement. When the buckling member 3 moves to be detached from the fastening portion 12, the buckling member 3 may be automatically detached or be passively detached from the fastening portion 12 along the second axis Y relative to the body 1.

In some embodiments, the return structure may cause the buckling member 3 to be automatically detached from the fastening portion 12, which means that a user does not pull the buckling member 3, and the buckling member 3 automatically detaches from the fastening portion 12 during movement with the clamping member 2. In some embodiments, the return structure may cause the buckling member 3 to be passively detached from the fastening portion 12, which means that a user pulls the buckling member 3 to detach the buckling member 3 from the fastening portion 12.

Referring to FIG. 2 and FIG. 3 again, the body 1 has a bottom plate 1a and a side plate 1b. The bottom plate 1a and the side plate 1b are connected and form an angle relative to each other. The guide rail portion 102 is disposed on one side of the side plate 1b and connected to the bottom plate 1a. The fastening portion 12 is disposed on the other side of the side plate 1b away from the guide rail portion 102. The first sliding portion 11 is disposed on one side of the bottom plate 1a away from the guide rail portion 102 along the first axis Z. The fastening portion 12 and the first sliding portion 11 form an angle relative to each other. In more detail, the fastening portion 12 and the first sliding portion 11 form an angle relative to each other in the direction of the second axis Y and the direction of the third axis X. However, the present invention is not limited thereto. In some embodiments, the fastening portion 12 and the first sliding portion 11 may also be disposed in a same axial direction of the body 1, for example, both are disposed in the direction of the third axis X.

Referring to FIG. 2 and FIG. 3 again, in some embodiments, one side of the clamping member 2 is docked to the first sliding portion 11. The buckling member 3 of the clamping member 2 is docked to the fastening portion 12 of the body 1, so that the clamping member 2 can smoothly slide between the first position P1 and the second position P2 after two sides thereof are docked to the body 1.

Referring to FIG. 2 and FIG. 3 again, in some embodiments, the body 1 is provided with a second sliding portion 15. The second sliding portion 15 is disposed on one side of the side plate 1b away from the guide rail portion 102 along the first axis Z. Since the side plate 1b and the bottom plate 1a form an angle relative to each other, the second sliding portion 15 and the first sliding portion 11 also form an angle relative to each other. In more detail, the first sliding portion 11 and the second sliding portion 15 are parallel to each other in the direction of the first axis Z, and form an angle relative to each other in the direction of the third axis X and the direction of the second axis Y. However, the present invention is not limited thereto. In some embodiments, the second sliding portion 15 and the first sliding portion 11 may also be disposed in a same axial direction of the body 1, for example, both are disposed in the direction of the third axis X.

Referring to FIG. 2 and FIG. 3 again, in some embodiments, the clamping member 2 includes a third sliding portion 26 and a fourth sliding portion 27. The third sliding portion 26 and the fourth sliding portion 27 are respectively to be docked to the body 1. The third sliding portion 26 and the fourth sliding portion 27 form an angle relative to each other. In more detail, the third sliding portion 26 and the fourth sliding portion 27 are parallel to each other in the direction of the first axis Z, and form an angle relative to each other in the direction of the third axis X and the direction of the second axis Y. However, the present invention is not limited thereto. The first sliding portion 11 and the second sliding portion 15 are respectively docked to the clamping member 2. The third sliding portion 26 and the fourth sliding portion 27 are respectively docked to the body 1, so that the clamping member 2 can smoothly slide between the first position P1 and the second position P2 after being docked to the body 1. In some embodiments, the third sliding portion 26 and the fourth sliding portion 27 are respectively docked to the bottom plate 1a and the side plate 1b of the body 1. In more detail, the third sliding portion 26 is docked to the second sliding portion 15. The first sliding portion 11 and the fourth sliding portion 27 are parallel to each other in the direction of the first axis Z on the side plate 1b, and form an angle relative to each other in the direction of the third axis X and the direction of the second axis Y.

Referring to FIG. 2 and FIG. 3 again, in some embodiments, the first sliding portion 11 includes a first long groove 11 and a first locking member 11 (for example, a rivet or a screw, the first long groove 11 and the first locking member 11 are used as an example for description, and a reference numeral same as that of the first sliding portion 11 is given). The first locking member 11 is threaded in the first long groove 11 and is locked to the clamping member 2. When the clamping member 2 moves to the first position P1 or the second position P2 relative to the body 1, the first locking member 11 terminates at two sides of the first long groove 11, respectively. As shown in FIG. 12, when the first locking member 11 is located on one side of the first long groove 11 away from the guide rail portion 102, the clamping member 2 moves to the first position P1 relative to the body 1. As shown in FIG. 14, when the first locking member 11 is located on the other side of the first long groove 11 facing the guide rail portion 102, the clamping member 2 moves to the second position P2 relative to the body 1.

Figure 8:
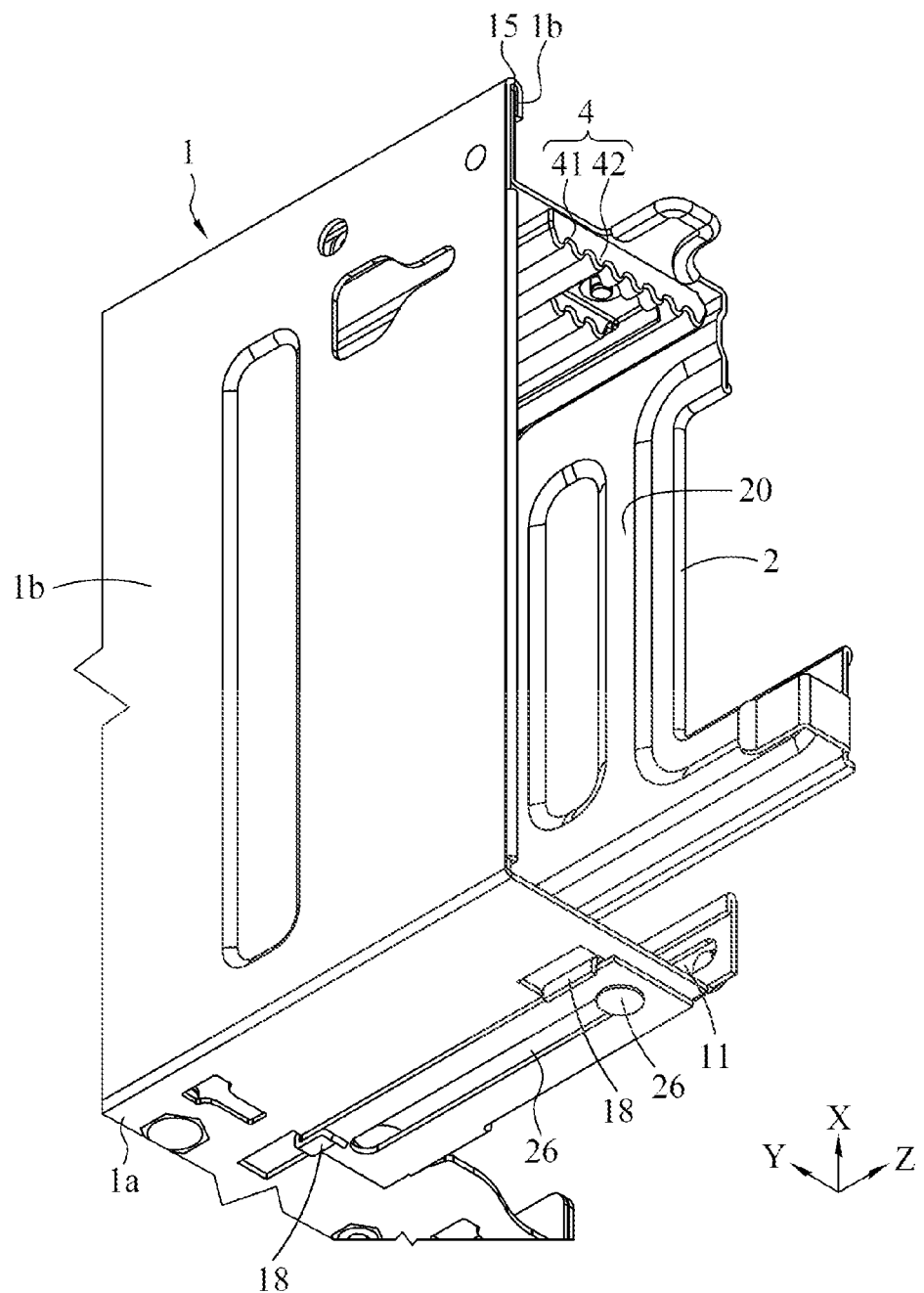
FIG. 8 illustrates a schematic partial enlarged view of a cage from a perspective of a reference numeral 8 in FIG. 2.

Referring to FIG. 2 and FIG. 3 again, in some embodiments, the third sliding portion 26 includes a third long groove 26 and a third locking member 26 (for example, a rivet or a screw, the third long groove 26 and the third locking member 26 are used as an example for description, and a reference numeral same as that of the third sliding portion 26 is given). The third locking member 26 is threaded in the third long groove 26 and is locked to the body 1. When the clamping member 2 moves to the first position P1 or the second position P2 relative to the body 1, the third locking member 26 terminates at two sides of the third long groove 26, respectively. As shown in FIG. 8, when the third locking member 26 is located on one side of the third long groove 26 facing the guide rail portion 102, the clamping member 2 moves to the second position P2 relative to the body 1. As shown in FIG. 8, when the clamping member 2 moves to the first position P1 relative to the body 1, the third locking member 26 is located on the other side of the third long groove 26 away from the guide rail portion 102.

Referring to FIG. 2 and FIG. 3 again, in some embodiments, the fourth sliding portion 27 includes a fourth long groove 27 and a fourth locking member 27 (for example, a rivet or a screw, the fourth long groove 27 and the fourth locking member 27 are used as an example for description, and a reference numeral same as that of the fourth sliding portion 27 is given). The fourth locking member 27 is threaded in the fourth long groove 27 and is locked to the body 1. When the clamping member 2 moves to the first position P1 or the second position P2 relative to the body 1, the fourth locking member 27 terminates at two sides of the fourth long groove 27, respectively. As shown in FIG. 12, when the fourth locking member 27 is located on one side of the fourth long groove 27 facing the guide rail portion 102, the clamping member 2 moves to the first position P1 relative to the body 1. As shown in FIG. 14, when the fourth locking member 27 is located on the other side of the fourth long groove 27 away from the guide rail portion 102, the clamping member 2 moves to the second position P2 relative to the body 1.

Referring to FIG. 2 and FIG. 3 again, in some embodiments, the second sliding portion 15 includes a folding portion 15 and a trench 15 (the folding portion 15 and the trench 15 are used as an example for description below, and a reference numeral same as that of the second sliding portion 15 is given). The folding portion 15 is folded toward the bottom plate 1a from one side of the side plate 1b, the trench 15 is located between the folding portion 15 and the side plate 1b. A side end 25 on the other side of the clamping member 2 is inserted into the trench 15 for limiting. When the clamping member 2 moves to the first position P1 or the second position P2 relative to the body 1, the side end 25 slides into or out of the trench 15.

Figure 4:
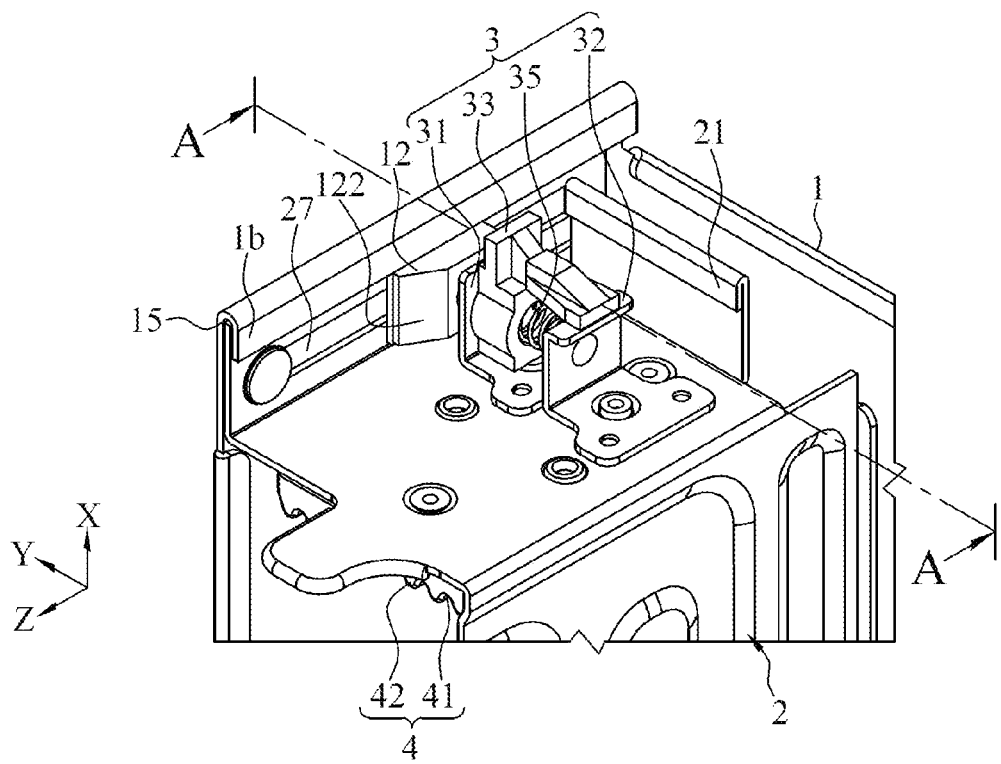
FIG. 4 illustrates a schematic partial enlarged view of a cage from a perspective of FIG. 2 according to some embodiments.
Figure 5:
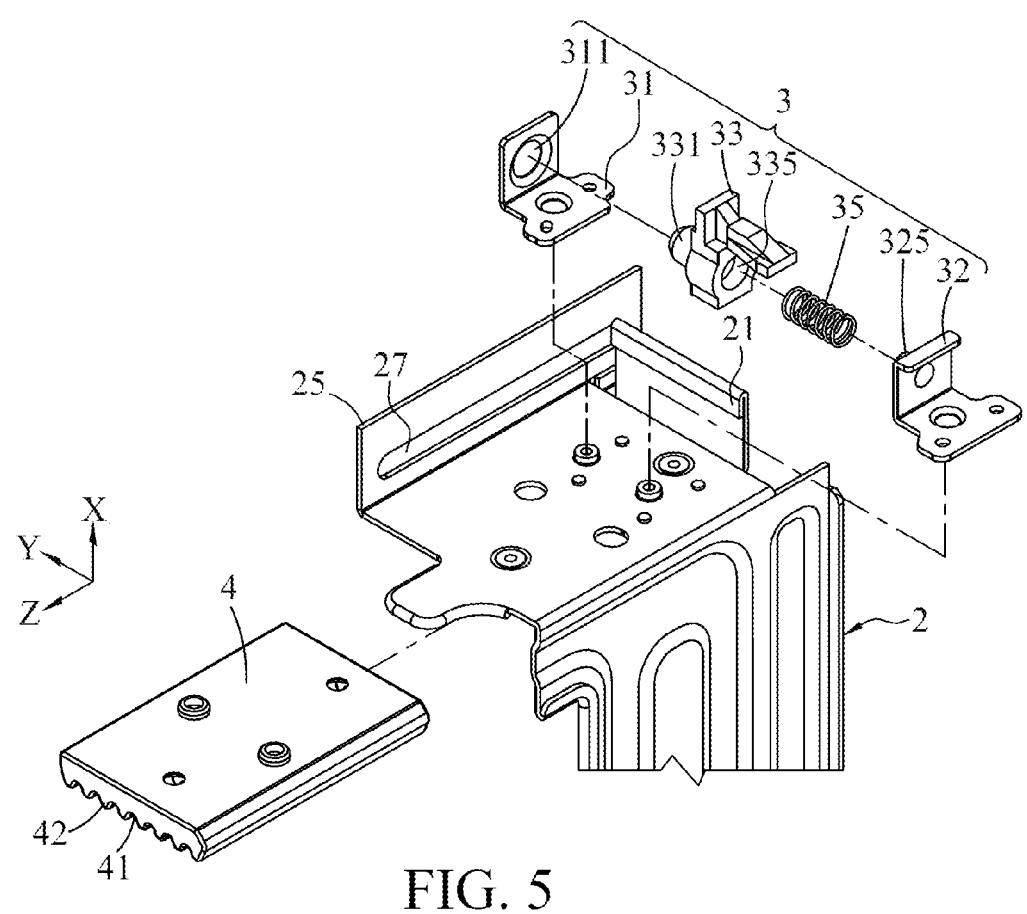
FIG. 5 illustrates a schematic exploded view of the cage in FIG. 4.
Figure 6:
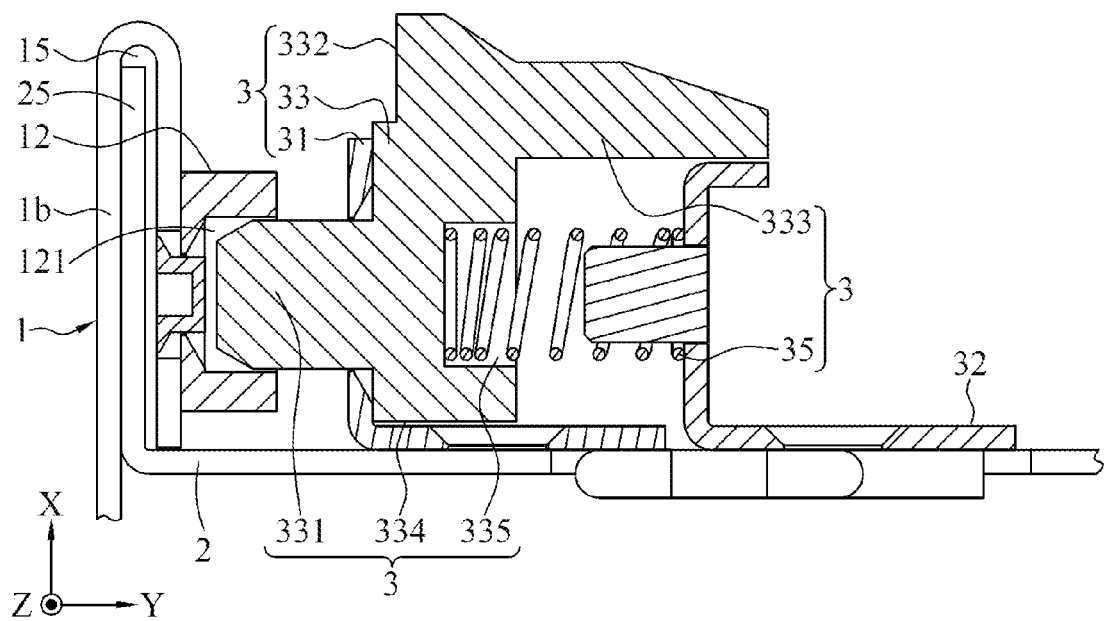
FIG. 6 illustrates a schematic cross-sectional view of a position A-A in FIG. 4, where a buckling member is automatically snap-fitted to a fastening portion.
Figure 7:
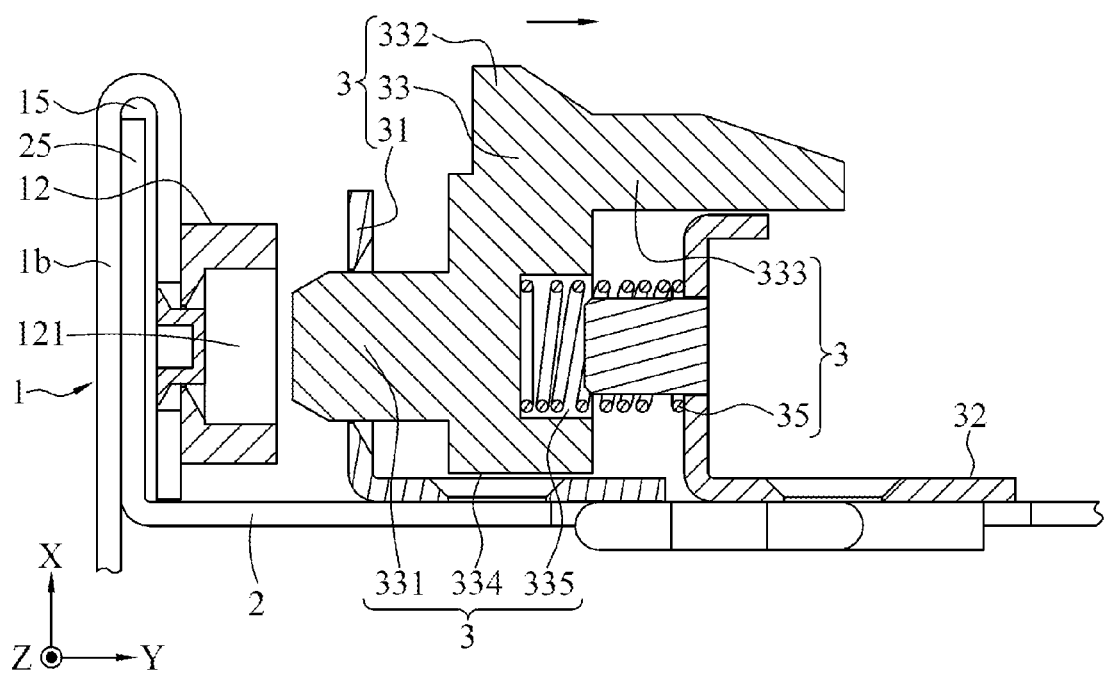
FIG. 7 illustrates a schematic cross-sectional view of the position A-A in FIG. 4, where a buckling member is detached from a fastening portion.

Referring to FIG. 4 to FIG. 7 together, FIG. 4 illustrates a schematic partial enlarged view of a cage 200 from a perspective of FIG. 2. FIG. 5 illustrates a schematic exploded view of the cage 200 in FIG. 4. FIG. 6 illustrates a schematic cross-sectional view of a position A-A in FIG. 4, where a buckling member 3 is automatically snap-fitted to a fastening portion 12. FIG. 7 illustrates a schematic cross-sectional view of the position A-A in FIG. 4, where a buckling member 3 is detached from a fastening portion 12. In some embodiments, the buckling member 3 may move along a second axis Y. As shown in FIG. 6, the buckling member 3 moves toward the second sliding portion 15 on the clamping member 2 to be snap-fitted to the fastening portion 12. As shown in FIG. 7, the buckling member 3 moves away from the second sliding portion 15 on the clamping member 2 to be detached from the fastening portion 12. In some embodiments, the buckling member 3 is automatically snap-fitted to the fastening portion 12 by using an elastic return function.

Referring to FIG. 4 to FIG. 7 again, in some embodiments, the buckling member 3 is provided with a return structure to have an elastic function. The buckling member 3 includes a first stop 31, a second stop 32, a buckling block 33 (for example, but not limited to a plastic material), and a return member 35. The buckling block 33 and the return member 35 are located between the first stop 31 and the second stop 32. The buckling block 33 abuts between the first stop 31 and the second stop 32. Two ends of the return member 35 respectively abut against the buckling block 33 and the second stop 32. The buckling block 33 is provided with a buckling portion 331 The buckling portion 331 is engaged with the fastening portion 12 to fix the clamping member 2 and the body 1, so as to support the expansion module 400.

In some embodiments, the first stop 31 is provided with a through hole 311, and the buckling portion 331 is a convex post. The buckling portion 331 is sleeved in the through hole 311 of the first stop 31. When the buckling portion 331 is automatically snap-fitted to or detached from the fastening portion 12, the buckling portion 331 is restricted in the through hole 311 to prevent the buckling block 33 from being detached from the first stop 31. The first stop 31 and the second stop 32 may be positioned on the clamping member 2 by means of locking, attachment, riveting, or the like.

In some embodiments, a buckling hole 121 is provided on a side surface of the fastening portion 12 facing the buckling member 3. When the buckling member 3 is at the second position P2, the buckling portion 331 is engaged with the buckling hole 121 to fix the clamping member 2 and the body 1, so as to support the expansion module 400. In some embodiments, a surface of the buckling portion 331 and the buckling hole 121 of the fastening portion 12 may be concave and convex arc surfaces (not shown, for example, an inner side of the buckling hole 121 shown in FIG. 7 is changed to a concave arc surface, and the surface of the buckling portion 331 is changed to a convex arc surface) docked to each other. When a specific force is applied to push the clamping member 2 out of the body 1, the convex arc surface of the buckling portion 331 is guided by the concave arc surface of the fastening portion 12, to move the buckling portion 331 to outside of the buckling hole 121, so that the buckling portion 331 is automatically detached from the fastening portion 12. In this way, the buckling portion 331 can be pushed out to be detached from the fastening portion 12 by applying a relatively small force.

Referring to FIG. 4 to FIG. 7 again, in some embodiments, the buckling block 33 is provided with a pulling portion 332 and a slider 333. The slider 333 extends away from the return member 35 from a side of the pulling portion 332. The slider 333 abuts against the second stop 32. A side surface 334 of the buckling block 33 abuts against the first stop 31. As shown in FIG. 7, when a user pulls the pulling portion 332 away from the second sliding portion 15 for unlocking, the buckling block 33 abuts against the second stop 32 by using the slider 333, and the side surface 334 of the buckling block 33 abuts against the first stop 31, so that the buckling block 33 can smoothly slide on the clamping member 2.

In some embodiments, a groove 335 is provided on the side of the buckling block 33 facing the second stop 32, that is, a groove 335 is provided on one side of the buckling block 33 opposite to the buckling portion 331. The second stop 32 is provided with a bump 325 corresponding to the groove 335, that is, the second stop 32 is provided with a bump 325 facing the buckling block 33. One end of the return member 35 is restricted in the groove 335, and the other end thereof is sleeved on the bump 325. In some embodiments, the return member 35 is a compression spring, which provides a rebound force to push the buckling block 33 back to the position at which the fastening portion 12 is snap-fitted shown in FIG. 6, so that the buckling member 3 is automatically snap-fitted to the fastening portion 12.

Referring to FIG. 4 to FIG. 7 again, in some embodiments, one side of the clamping member 2 includes a holding portion 21. The holding portion 21 extends away from the bottom plate 1a of the body 1. The holding portion 21 is disposed at a position adjacent to the buckling member 3 so that a user can operate the buckling member 3 and the holding portion 21 and move the clamping member 2 with one hand.

Figure 9:
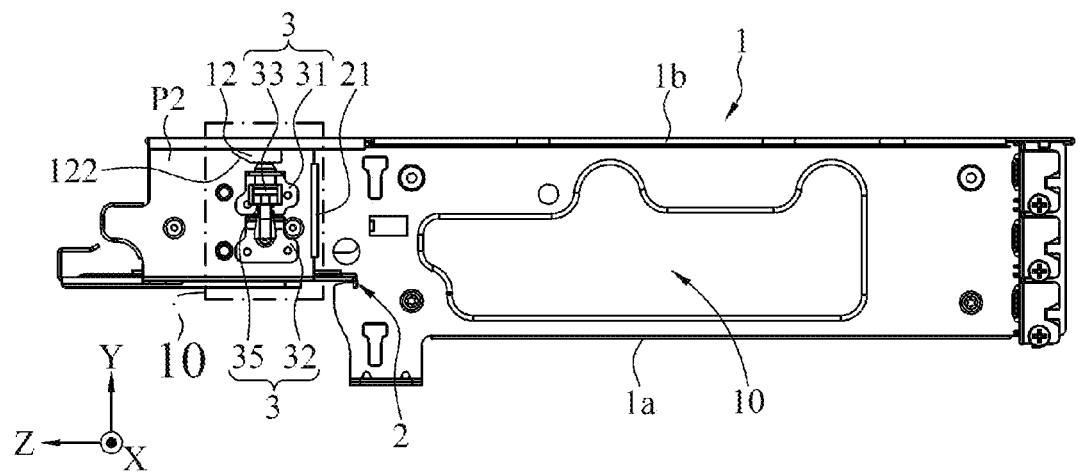
FIG. 9 illustrates a schematic top view of a cage according to some embodiments, showing a state in which a clamping member is located in an accommodating area.
Figure 10:
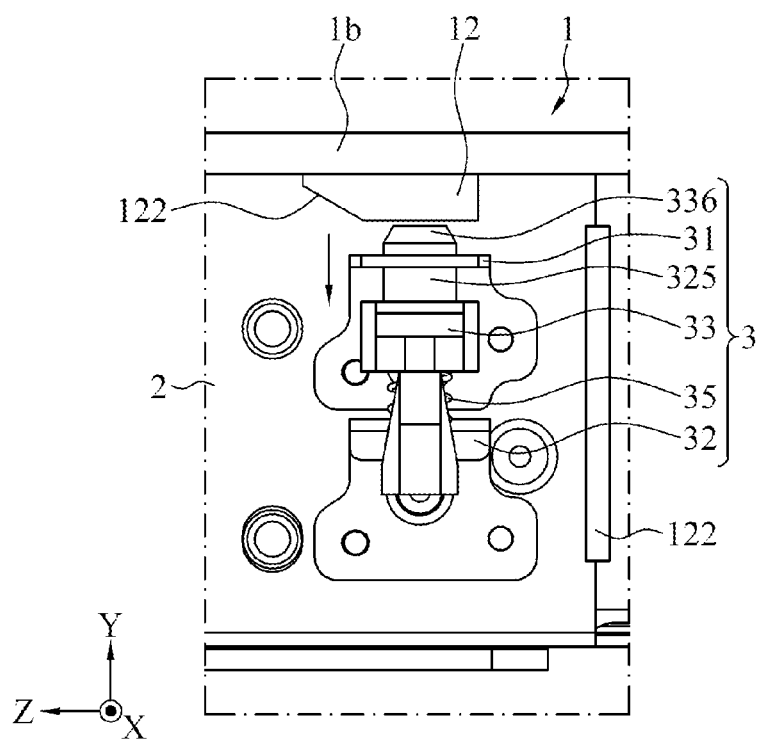
FIG. 10 illustrates a schematic enlarged view of a central line frame of a reference numeral 10 in FIG. 9, showing a state in which a buckling member is detached from a fastening portion.

Referring to FIG. 4 to FIG. 7 again, in some embodiments, in the side view in FIG. 7 and the top view in FIG. 9 and FIG. 10, to move the clamping member 2 from the second position P2 to the first position P1, a user may first push the pulling portion 332 in the direction of the second axis Y with a thumb (not shown), so that the pulling portion 332 moves in an arrow direction in FIG. 7 to detach the buckling portion 331 of the buckling member 3 from the fastening portion 12. In this case, the buckling portion 331 exits from the buckling hole 121, and the return member 35 is compressed, so that the buckling member 3 is passively detached from the fastening portion 12. Then, an index finger, a middle finger, a ring finger, and a little finger (not shown) abut against the holding portion 21, to push the holding portion 21 away from the guide rail portion 102 in the direction of the first axis Z, so that the clamping member 2 is moved toward the first position P1. The user may cause the clamping member 2 to move from the second position P2 (shown in FIG. 15) to the first position P1 (shown in FIG. 13) by moving the clamping member 2 and the buckling member 3 with one hand, to perform subsequent mounting or removal of the expansion module 400.

Referring to FIG. 4 to FIG. 7 again, in some embodiments, the fastening portion 12 includes an engaging block 12 (the engaging block 12 is used as an example for description below, and a reference numeral same as that of the fastening portion 12 is given). Hardness of the engaging block 12 is less than that of metal (the engaging block 12 is made of, for example, but is not limited to, a plastic material), which facilitates cushioning contact between the buckling block 33 and the engaging block 12. The body 1 is provided with an extension portion 14. The extension portion 14 is a plate extending from the folding portion 15 toward the bottom plate 1a. The engaging block 12 is positioned on the extension portion 14, and the engaging block 12 may be positioned on the extension portion 14 by means of locking, attachment, riveting, or the like. The present invention is not limited thereto. In some embodiments, the engaging block 12 may be directly positioned on the body 1 (not shown) by means of locking, attachment, riveting, or the like.

Referring to FIG. 3 and FIG. 8 again, FIG. 8 illustrates a schematic partial enlarged view of a cage 200 from a perspective of a reference numeral 8 in FIG. 2. In some embodiments, the body 1 includes one or more limiting portions 18. The limiting portions 18 are located on a side away from the guide rail portion 102. The limiting portion 18 has a baffle 18 extending and bending from the bottom plate 1a (the baffle 18 is used as an example for description, and a reference numeral same as that of the limiting portion 18 is given). The limiting portion 18 restricts the clamping member 2 to the body 1. In more detail, the limiting portion 18 is disposed on the bottom plate 1a of the body 1 and restricts a side of the clamping member 2 adjacent to the fourth sliding portion 27. When the clamping member moves to the second position P2, the clamping member 2 is clamped by the baffle 18 facing the guide rail portion 102 to limit a degree of freedom of the clamping member 2 in the direction of the first axis Z, and the side of the clamping member 2 is stopped by another baffle 18 facing the guide rail portion 102 to limit a degree of freedom of the clamping member 2 in the direction of the second axis Y.

Referring to FIG. 11 to FIG. 14, FIG. 11 is a schematic diagram of appearances of a cage 200 and an expansion module 400, showing a state in which a clamping member 2 slides out of an accommodating area 10 and expansion modules 400 with different lengths are not mounted in the accommodating area 10, FIG. 12 is a schematic diagram of appearances of a cage 200 and an expansion module 400, showing a state in which a clamping member 2 slides out of an accommodating area 10 for the expansion module 400 to be mounted in the accommodating area 10, FIG. 13 illustrates a schematic top view of the state in FIG. 12, and FIG. 14 is a schematic diagram of appearances of a cage 200 and an expansion module 400, showing a state in which a clamping member 2 is located in an accommodating area 10 and the clamping member 2 covers a side of the expansion module 400, where a buckling member 3 is automatically snap-fitted to a fastening portion 12. In some embodiments, an adapter plate 300 is mounted in the cage 200. The adapter plate 300 has an electrical connection port 301 thereon. When the expansion module 400 is mounted in the cage 200 along the third axis X as shown in FIG. 12, an electrical connection port 401 of the expansion module 400 is electrically connected to the electrical connection port 301 on the adapter plate 300. In some embodiments, a side of the expansion module 400 has a plug-in end 402 for plugging a transmission line (not shown). In some embodiments, the clamping member 2 has a frame opening 20 (shown in FIG. 14), and the plug-in end 402 on the side of the expansion module 400 is exposed to the frame opening 20, to facilitate plugging of the transmission line (not shown) into the plug-in end 402.

Figure 16:
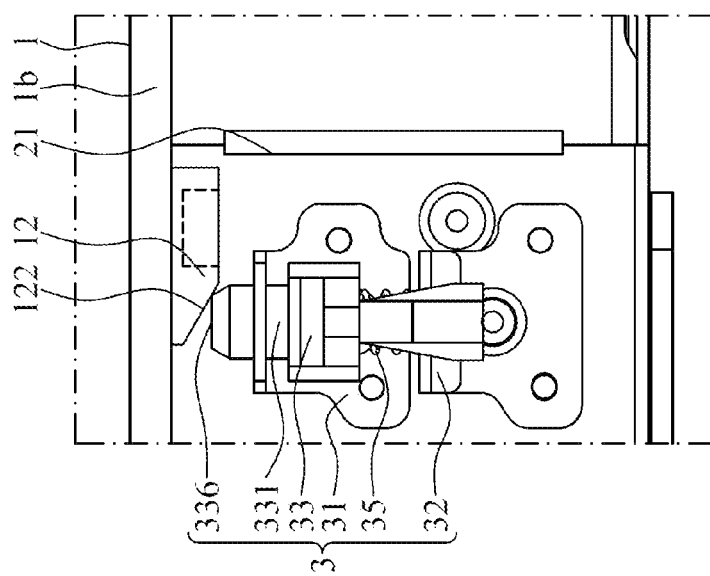
FIG. 16 illustrates a schematic enlarged view of a central line frame of a reference numeral 16 in FIG. 15, showing a state in which a buckling member is guided to a fastening portion.
Figure 17:
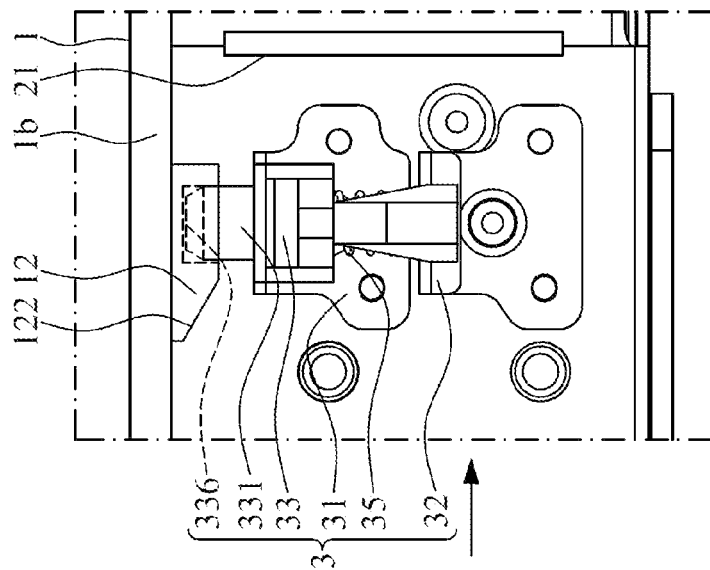
FIG. 17 illustrates a schematic enlarged view of the central line frame of the reference numeral 16 in FIG. 15, showing a state in which a buckling member is snap-fitted to a fastening portion.

Referring to FIG. 16 to FIG. 17, FIG. 16 illustrates a schematic enlarged view of a central line frame of a reference numeral 16 in FIG. 15, showing a state in which a buckling member 3 is guided to a fastening portion 12, and FIG. 17 illustrates a schematic enlarged view of a central line frame of a reference numeral 16 in FIG. 15, showing a state in which a buckling member 3 is snap-fitted to a fastening portion 12. In some embodiments, an engaging block 12 is provided with a buckling hole 121 and a guiding surface 122. The guiding surface 122 is configured to guide a buckling portion 331 to be positioned in the buckling hole 121. When the clamping member 2 moves from a first position P1 to a second position P2 (as shown in FIG. 15, the clamping member 2 moves toward the guide rail portion 102), the buckling portion 331 of the buckling member 3 is in contact with the guiding surface 122 on the engaging block 12 and is guided to advance toward the buckling hole 121. Referring to FIG. 17, after the clamping member 2 is continuously moved to the second position P2 toward the guide rail portion 102, the buckling portion 331 is guided to be positioned in the buckling hole 121 via the guiding surface 122.

Figure 19:
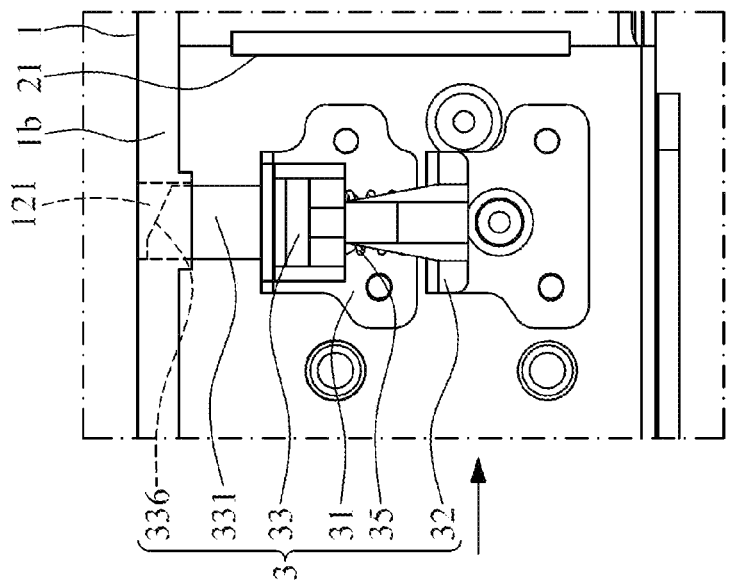
FIG. 19 illustrates a schematic enlarged view of FIG. 17, showing a state in which a buckling member is snap-fitted to a fastening portion, which is another guiding structure for the buckling member and the fastening portion.
Figure 18:
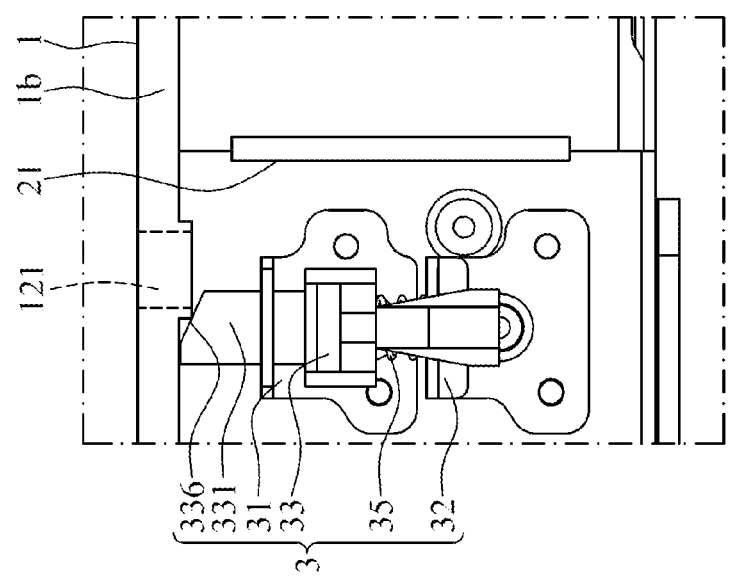
FIG. 18 illustrates a schematic enlarged view of FIG. 16, showing a state in which a buckling member is guided to a fastening portion, which is another guiding structure for the buckling member and the fastening portion.

Referring to FIG. 18 and FIG. 19, FIG. 18 illustrates a schematic enlarged view of FIG. 16, showing a state in which a buckling member 3 is guided to a fastening portion 12, which is another guiding structure for the buckling member 3 and the fastening portion 12, and FIG. 19 illustrates a schematic enlarged view of FIG. 17, showing a state in which a buckling member 3 is snap-fitted to a fastening portion 12, which is another guiding structure for the buckling member 3 and the fastening portion 12. In some embodiments, a buckling portion 331 is provided with a guiding surface 336 (shown in FIG. 18). The buckling portion 331 is guided by the guiding surface 336 to be positioned in the buckling hole 121. When the clamping member 2 moves from a first position P1 to a second position P2 (as shown in FIG. 19, the clamping member 2 moves toward the guide rail portion 102), the guiding surface 336 on the buckling portion 331 of the buckling member 3 is in contact with a peripheral wall surface of the buckling hole 121 for guiding the buckling portion 331 to advance toward the buckling hole 121. Referring to FIG. 19, after the clamping member 2 is continuously moved to the second position P2 toward the guide rail portion 102, the buckling portion 331 is guided to be positioned in the buckling hole 121 via the guiding surface 336.

Figure 20:
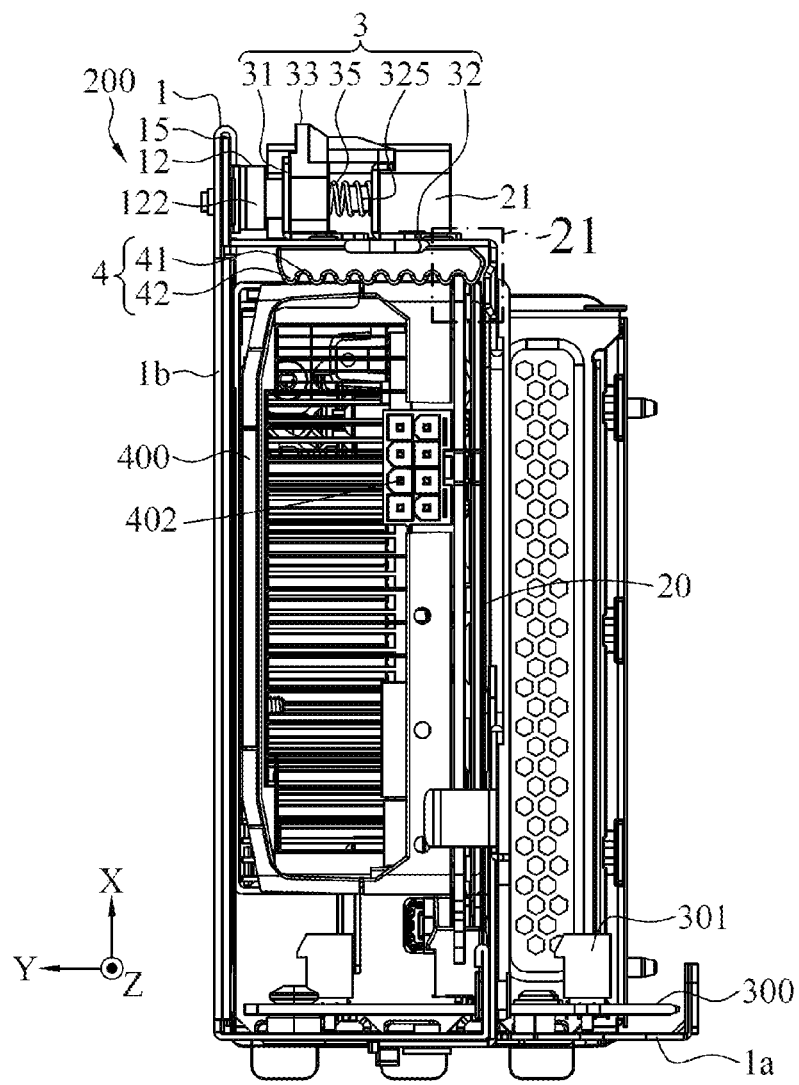
FIG. 20 illustrates a schematic side view of FIG. 14 from a perspective away from a guide rail portion, showing a state in which a limiting member abuts against an expansion module.
Figure 21:
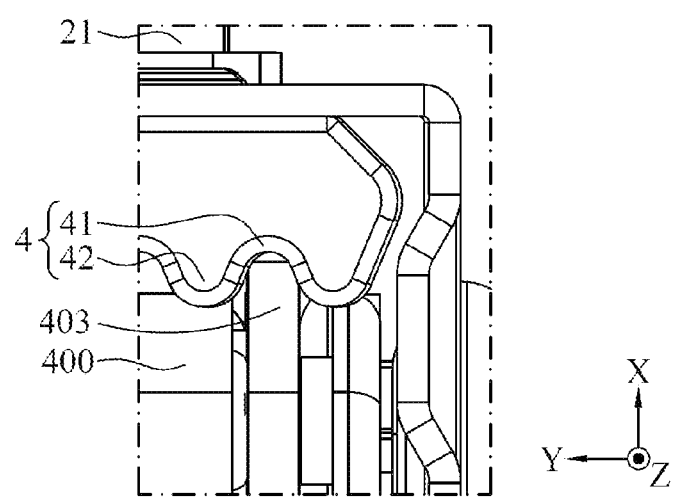
FIG. 21 illustrates a schematic enlarged view of a central line frame of a reference numeral 21 in FIG. 20, showing a state in which a recess of a limiting member is clamped at a side end of an expansion module.

Referring to FIG. 20 and FIG. 21, FIG. 20 illustrates a schematic side view of FIG. 14 away from a guide rail portion 102, showing a state in which a limiting member 4 abuts against an expansion module 400, and FIG. 21 illustrates a schematic enlarged view of a central line frame of a reference numeral 21 in FIG. 20, showing a state in which a recess 41 of a limiting member 4 is clamped at a side end of an expansion module 400. In some embodiments, a cage 200 further includes a limiting member 4. The limiting member 4 is disposed on a side of a clamping member 2 facing a bottom plate 1a of a body 1. The limiting member 4 is disposed on a side surface of the clamping member 2 that faces the body 1. The limiting member 4 may be a cushion block 4 made of a soft material (the cushion block 4 is used as an example for description below, and a reference numeral same as that of the limiting member 4 is given). The cushion block 4 facilitates cushioning contact with the expansion module 400, so that the expansion module 400 is restricted between the clamping member 2 and the bottom plate 1a of the body 1. The expansion module 400 is a full-height PCIe card, but the present invention is not limited thereto. In some embodiments, heights of the cushion block 4 and the clamping member 2 may vary to facilitate cushioning contact with the expansion module 400. The expansion module 400 is a half-height PCIe card. The cushion block 4 may be positioned on at inner side of the clamping member 2 by means of locking, attachment, riveting, or the like.

In some embodiments, expansion modules 400 of different heights and different widths may be mounted in the body 1 for clamping by the clamping member 2. For example, the first expansion module 400 indicated by an upper solid line in FIG. 11 has a first length L1, a first width W1, and a first height H1. For example, a second expansion module 400 indicated by an upper broken line in FIG. 11 has a second length L2, a second width W2, and a second height H2. The first length L1 is greater than the second length L2, the first width W1 is greater than the second width W2, and the first height H1 is greater than the second height H2. As shown in FIG. 14, the first expansion module 400 is mounted in the body 1 for clamping by the clamping member 2.

In some embodiments, a side surface of the cushion block 4 has a plurality of recesses 41 (whose cross-sectional appearance may be U-shaped or V-shaped) and a plurality of protrusions 42 alternately arranged, and is in contact with a side end 403 of the expansion module 400. An overall cross-sectional appearance of the plurality of recesses 41 and the plurality of protrusions 42 is wavy. When the clamping member 2 slides into the body 1, a recess 41 of the cushion block 4 is correspondingly clamped at the side end 403 of the expansion module 400.

In some embodiments, the cushion block 4 at the inner side of the clamping member 2 may be correspondingly clamped at side ends 403 of the expansion modules 400 of different sizes by using any of the plurality of recesses 41. For example, when the first expansion module 400 indicated by the upper solid line shown in FIG. 11 is used, the side end 403 of the first expansion module 400 shown in FIG. 20 and FIG. 21 is snap-fitted to the recess 41 of the upper cushion block 4 farthest away from the fastening portion 12. The present invention is not limited thereto. For example, when the second expansion module 400 indicated by the upper broken line in FIG. 11 is used, as shown in FIG. 20, the side end 403 of the second expansion module 400 may also be snap-fitted to one of the recesses 41 of the limiting member 4. The present invention is not limited thereto. In other words, the cushion block 4 may be snap-fitted to the side end 403 of the expansion module 400 depending on the expansion modules 400 of different sizes, to assist positioning and cushion impact.

The above plurality of recesses 41 and the plurality of protrusions 42 are merely examples. In some embodiments, a side surface of the limiting member 4 is required to have only at least one recess 41. As shown in FIG. 20, only one of the plurality of recesses 41 farthest away from the fastening portion 12 (or at any position) remains, or there may be at least one recess 41. The present invention is not limited thereto.

Figure 22:
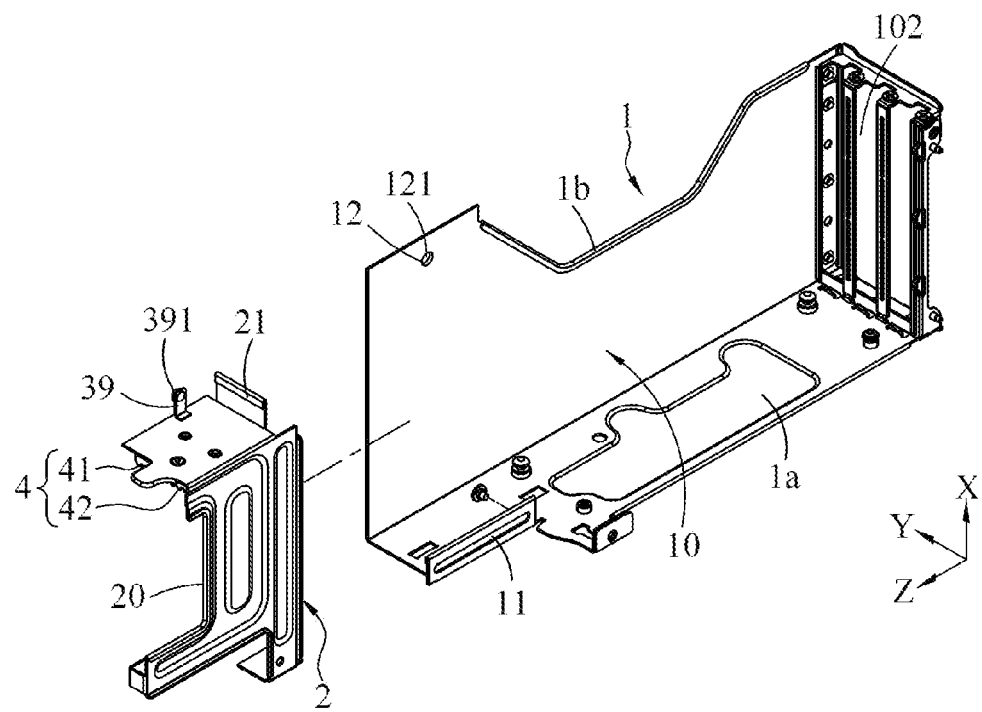
FIG. 22 illustrates a schematic exploded view of a cage according to some embodiments, which is another docking structure for a buckling member and a fastening portion.

Referring to FIG. 22, FIG. 22 is a schematic exploded view of a cage 200, which shows another docking structure for a buckling member 3 and a fastening portion 12. In some embodiments, the fastening portion 12 is provided with a buckling hole 121. The buckling hole 121 is formed on a side plate 1b of a body 1 (for example, the embodiment shown in FIG. 22 omitting the engaging block 12 shown in FIG. 3).

Referring to FIG. 22, in some embodiments, the buckling member 3 is provided with a leaf spring 39 (which is another embodiment different from the buckling block 33 shown in FIG. 5). A protrusion 391 is provided on one side of the leaf spring 39. The protrusion 391 extends toward the body 1. The protrusion 391 of the leaf spring 39 is configured to be automatically snap-fitted to or detached from the buckling hole 121 of the fastening portion 12 (which is not shown, but for example, the detached state shown in FIG. 16 and the snapped state shown in FIG. 17). The leaf spring 39 is fixedly disposed on the clamping member 2, the leaf spring 39 has elasticity, and an arc surface of the protrusion 391 facilitates contact with a peripheral wall surface of the buckling hole 121. When a holding portion 21 is pushed to move the clamping member 2 from the first position P1 to the second position P2 (for example, move the clamping member from the first position P1 shown in FIG. 13 to the second position P2 shown in FIG. 15), the protrusion 391 of the leaf spring 39 is automatically snap-fitted to the buckling hole 121 of the fastening portion 12. When the holding portion 21 is pulled to move the clamping member 2 from the second position P2 to the first position P1, the protrusion 391 of the leaf spring 39 is detached from the fastening portion 12.

Figure 23:
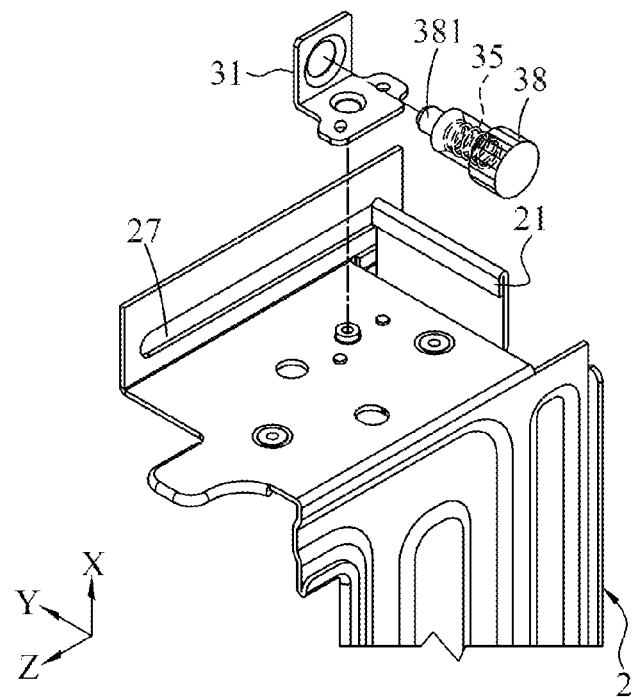
FIG. 23 illustrates a schematic exploded view of a cage according to some embodiments, which is another docking structure for a buckling member.

Referring to FIG. 23, FIG. 23 is a schematic exploded view of a cage 200, which shows another docking structure for a buckling member 3. In some embodiments, the buckling member 3 includes a first stop 31 and a return member 38 (which is another embodiment different from the buckling block 33 shown in FIG. 5). The return member 38 has a spring therein, and a buckling portion 381 is provided on one side of the return member 38. The buckling portion 381 of the return member 38 threads the first stop 31 (which is not shown, but as shown in FIG. 23, one side of the return member 38 is engaged on a periphery of a through hole 311 of the first stop 31). The buckling portion 381 threads the through hole 311 of the first stop 31. The buckling portion 381 is snap-fitted to or detached from the fastening portion 12 (which not shown, but for example, the detached state shown in FIG. 13 and the snapped state as shown in FIG. 15). The buckling portion 381 may be automatically snap-fitted to the fastening portion 12 (not shown) under pressing of the spring, and the return member 38 may be pulled to drive the buckling portion 381 to be detached from the fastening portion 12 (not shown).

Referring to FIG. 24, FIG. 24 is a schematic diagram of appearances of a cage 200 and an expansion module 400, showing a state in which a clamping member 2 is located in another accommodating area 10, and the clamping member 2 covers a side of the expansion module 400 indicated by two dot lines. In some embodiments, the body 1 includes a plurality of fastening portions 12 (for example, two, three, or four fastening portions 12). The plurality of fastening portions 12 may be equidistantly distributed. The buckling member 3 is adapted to be selectively snap-fitted to one of the plurality of fastening portions 12, so that the clamping member 2 is restricted at different positions of the body 1 to cover the expansion modules 400 of different lengths.

For example, as shown in FIG. 24, the body 1 includes three fastening portions 12. When the buckling member 3 is snap-fitted to a first fastening portion 12 of the body 1 closest to the guide rail portion 102, the clamping member 2 is located on one side closest to the guide rail portion 102, and the clamping member 2 is restricted inside the body 1 and clamps an expansion module 400 of a third length L3. The length of the expansion module 400 of the third length L3 of is less than the length of the expansion module 400 of the first length L1 or the length of the expansion module 400 of the second length L2 shown in FIG. 11. In some embodiments, if the buckling member 3 is snap-fitted to a second fastening portion 12 of the body 1 farthest away from the guide rail portion 102, the clamping member 2 is located on one side away from the guide rail portion 102, and the clamping member 2 is restricted inside the body 1 and clamps the expansion module 400, which is a long card (not shown, but for example, the expansion module 400 of the first length L1 shown in FIG. 11 or the expansion module 400 of the second length L2 is placed in the body 1 shown in FIG. 24 and clamped). In some embodiments, if the buckling member 3 is snap-fitted to a third fastening portion 12 on the body 1, the third fastening portion 12 is located between the first fastening portion 12 and the second fastening portion 12, the clamping member 2 is located on one side away from the guide rail portion 102, and the clamping member 2 is restricted inside the body 1 and clamps an expansion module 400 of a fourth length L4 (not shown, but for example, the expansion module 400 indicated by a dot line shown in FIG. 24 is placed in the body 1 and clamped). The length of the expansion module 400 of the fourth length L4 is less than the length of the expansion module 400 of the first length L1 or the length of the expansion module 400 of the second length L2 as shown in FIG. 11, and the expansion module 400 of the fourth length L4 is greater than the expansion module 400 of the third length L3. Therefore, a plurality of fastening portions 12 are disposed at different positions on the body 1 (the fastening portions 12 may be disposed at any position on the body 1 according to actual requirements), so that the buckling member 3 can be selectively snap-fitted to one of the fastening portions 12, that is, after various expansion modules 400 are mounted in a single cage 200, the same clamping member 2 moves to different positions to cover the expansion modules 400 of different lengths.

Based on the above, according to some embodiments, the body is applicable to mounting of expansion modules of different lengths. The clamping member slides on the side of the body and covers the expansion module. When the expansion module is shaken due to a vibration drop test, transportation, or artificial or natural factors, the clamping member can prevent the expansion module from loosening or falling. Next, according to some embodiments, the holding portion of the clamping member and the buckling member are disposed adjacent to each other, so that by using one hand, the clamping member can be detached from the body and the holding portion can be pushed to detach, through sliding, the clamping member from the expansion module. In addition, according to some embodiments, the clamping member is slidably assembled on the side of the body, which requires only a space for the clamping member to slide on the side of the body, so that a small space is occupied. Moreover, according to some embodiments, a plug-in end at a side of the expansion module is exposed to inside of a frame opening formed by the clamping member, which facilitates electrical connection of a transmission line to the plug-in end.

What is claimed is:

1. A cage, comprising:
a body comprising a first sliding portion, a fastening portion, and an accommodating area, wherein the accommodating area comprises a guide rail portion, the guide rail portion and the first sliding portion are disposed on two sides of the accommodating area, respectively, and the fastening portion is disposed on one side of the accommodating area away from the guide rail portion;
a clamping member slidably disposed on the first sliding portion; and
a buckling member disposed on the clamping member and adapted to be in contact with the fastening portion, the clamping member comprises a holding portion, and the holding portion is adjacent to the buckling member.

2. The cage according to claim 1, wherein the clamping member is adapted to move along the first sliding portion between a first position and a second position; when the clamping member is in the first position, the clamping member is away from the guide rail portion and the buckling member is separated from the fastening portion; and when the clamping member is in the second position, the clamping member is adjacent to the guide rail portion and the buckling member is snap-fitted to the fastening portion.

3. The cage according to claim 2, wherein a return structure is provided for one of the buckling member and the fastening portion; and when the return structure is adapted to move the buckling member away from the fastening portion when the clamping member moves toward the first position.

4. The cage according to claim 3, wherein the buckling member comprises a first stop, a second stop, a buckling block and a return member, the buckling block is disposed between the first stop and the second stop, the return member is disposed between the buckling block and the second stop, a buckling portion is provided on one side of the buckling block, and the buckling portion is sleeved on the first stop and is adapted to be snap-fitted to or detached from the fastening portion.

5. The cage according to claim 4, wherein a groove is provided on one side of the buckling block opposite to the buckling portion, the second stop is provided with a bump facing the buckling block, one end of the return member is restricted in the groove, and the other end is sleeved on the bump.

6. The cage according to claim 4, wherein the fastening portion comprises an engaging block, the engaging block is positioned on the body and is provided with a buckling hole and a guiding surface, and the guiding surface is adapted to guide the buckling portion into the buckling hole.

7. The cage according to claim 4, wherein the fastening portion is provided with a buckling hole, the buckling portion is provided with a guiding surface, and the guiding surface is adapted to guide the buckling portion into the buckling hole.

8. The cage according to claim 3, wherein the buckling member comprises a first stop and a return member, a buckling portion is provided on one side of the return member, and the buckling portion of the return member is threaded in the first stop and is adapted to be snap-fitted to or detached from the fastening portion.

9. The cage according to claim 3, wherein the buckling member comprises a leaf spring, the leaf spring is provided with a protrusion extending toward the body, and the protrusion is adapted to be automatically snap-fitted to or detached from the fastening portion.

10. The cage according to claim 1, wherein the body has a bottom plate and a side plate, the bottom plate and the side plate are connected and form an angle relative to each other, the fastening portion is disposed on the side plate, the first sliding portion is disposed on the bottom plate, and the fastening portion and the first sliding portion form an angle relative to each other.

11. The cage according to claim 10, wherein the body comprises a second sliding portion, the second sliding portion is disposed on the side plate, the clamping member is docked to the second sliding portion, and the second sliding portion and the first sliding portion form an angle relative to each other.

12. The cage according to claim 11, wherein the clamping member comprises a third sliding portion and a fourth sliding portion, and the third sliding portion and the fourth sliding portion form an angle relative to each other and are respectively docked to the side plate and the bottom plate of the body.

13. The cage according to claim 12, wherein the first sliding portion comprises a first long groove and a first locking member that is threaded in the first long groove and is locked to the clamping member, the third sliding portion comprises a third long groove and a third locking member that is threaded in the third long groove and is locked to the body, and the fourth sliding portion comprises a fourth long groove and a fourth locking member that is threaded in the fourth long groove and is locked to the body.

14. The cage according to claim 12, wherein the second sliding portion comprises a folding portion and a trench, the folding portion is folded from one side of the side plate, and the trench is located between the folding portion and the side plate.

15. The cage according to claim 1, wherein one side of the body away from the guide rail portion comprises a plurality of limiting portions, and the limiting portions are adapted to limit the clamping member.

16. The cage according to claim 1, further comprising a limiting member disposed on a side surface of the clamping member that faces the body, and a side surface of the limiting member has a recess.

17. The cage according to claim 1, further comprising a limiting member, wherein the limiting member is disposed on a side surface of the clamping member that faces the body, and a side surface of the limiting member has a plurality of recesses and a plurality of protrusions arranged alternately.

18. The cage according to claim 1, wherein the buckling member comprises a first stop, a second stop, a buckling block, and a return member; the body is provided with a bottom plate and a side plate, and the bottom plate and the side plate form an angle relative to each other; the fastening portion is disposed on the side plate, the first sliding portion is disposed on the bottom plate, and the fastening portion and the first sliding portion form an angle relative to each other; the buckling block is disposed between the first stop and the second stop, and the return member is pressed between the buckling block and the second stop; a buckling portion is provided on one side of the buckling block, and the buckling portion is threaded in a through hole of the first stop and is adapted to be snap-fitted to or detached from the fastening portion; a groove is provided on one side of the buckling block opposite to the buckling portion, a bump protrudes from the second stop toward the buckling block, one end of the return member is restricted in the groove, and the other end of the return member is sleeved on the bump; the clamping member is adapted to move between a first position and a second position along the first sliding portion; the fastening portion comprises an engaging block, the body is provided with an extension portion, the engaging block is positioned on the extension portion and is provided with a guiding surface and a buckling hole, and the guiding surface is adapted to guide the buckling portion into the buckling hole; the body comprises a second sliding portion, and the second sliding portion is docked to the clamping member, is located on the side plate, and forms an angle relative to the first sliding portion; the clamping member comprises a third sliding portion and a fourth sliding portion and the third sliding portion and the fourth sliding portion are respectively docked to the side plate and the bottom plate of the body; the cage further comprises a limiting member, and the limiting member is located on a surface of the clamping member that faces the bottom plate and has a plurality of recesses and a plurality of protrusions arranged alternately.

19. A chassis, comprising:
a housing; and
at least one cage disposed in the housing and comprising a body, a clamping member, and a buckling member, wherein the body comprises a first sliding portion, a fastening portion, and an accommodating area, the accommodating area comprises a guide rail portion, the guide rail portion and the first sliding portion are disposed on two sides of the accommodating area, respectively, the fastening portion is disposed on one side of the accommodating area away from the guide rail portion, the clamping member is slidably disposed on the first sliding portion, and the buckling member is disposed on the clamping member and is adapted to be in contact with the fastening portion, the clamping member comprises a holding portion, and the holding portion is adjacent to the buckling member.

20. The chassis according to claim 19, wherein the clamping member of the at least one cage is adapted to move along the first sliding portion between a first position and a second position; when the clamping member is in the first position, the clamping member is away from the guide rail portion and the buckling member is separated from the fastening portion; and when the clamping member is in the second position, the clamping member is adjacent to the guide rail portion and the buckling member is snap-fitted to the fastening portion.

\* \* \* \* \*